United States Patent
Strid et al.

(10) Patent No.: US 9,372,214 B2
(45) Date of Patent: Jun. 21, 2016

(54) HIGH FREQUENCY INTERCONNECT STRUCTURES, ELECTRONIC ASSEMBLIES THAT UTILIZE HIGH FREQUENCY INTERCONNECT STRUCTURES, AND METHODS OF OPERATING THE SAME

(75) Inventors: Eric W. Strid, Portland, OR (US); Richard L. Campbell, Portland, OR (US); Kenneth R. Smith, Beaverton, OR (US); K. Reed Gleason, Portland, OR (US); Kooho Jung, Beaverton, OR (US)

(73) Assignee: Cascade Microtech, Inc., Beaverton, OR (US)

(*) Notice: Subject to any disclaimer, the term of this patent is extended or adjusted under 35 U.S.C. 154(b) by 885 days.

(21) Appl. No.: 13/484,548

(22) Filed: May 31, 2012

(65) Prior Publication Data

US 2012/0306587 A1 Dec. 6, 2012

Related U.S. Application Data

(60) Provisional application No. 61/493,314, filed on Jun. 3, 2011.

(51) Int. Cl.
*G01R 23/02* (2006.01)
*H01P 3/18* (2006.01)
*H01P 3/16* (2006.01)

(52) U.S. Cl.
CPC *G01R 23/02* (2013.01); *H01P 3/16* (2013.01); *H01P 3/18* (2013.01)

(58) Field of Classification Search
CPC .............. H01P 3/16; H01P 3/18; G01R 23/02
USPC ........... 333/1, 12, 239, 246, 248, 251; 324/95
See application file for complete search history.

(56) References Cited

U.S. PATENT DOCUMENTS 4,525,693 A * 6/1985 Suzuki et al. .................. 333/236
6,141,467 A 10/2000 Doerr
(Continued)

OTHER PUBLICATIONS

Fukuda, Satoshi, et al., "A 12.5+12.5Gb/s Full-Duplex Plastic Waveguide Interconnect," ISSCC 2011, Session 8, Architectures & Circuits for Next Generation Wireline Transceivers, 2011 IEEE International Solid-State Circuits Conference, Digest of Technical Papers, pp. 150-152, Feb. 22, 2011.

*Primary Examiner* — Benny Lee
*Assistant Examiner* — Jorge Salazar, Jr.
(74) *Attorney, Agent, or Firm* — Dascenzo Intellectual Property Law, P.C.

(57) ABSTRACT

High frequency interconnect structures, electronic assemblies that utilize high frequency interconnect structures, and methods of operating the same. The high frequency interconnect structures include a plurality of dielectric waveguides and are configured to communicatively connect a plurality of transmitters with a plurality of receivers and to convey a plurality of signals therebetween. The plurality of signals may include a plurality of electromagnetic waves and may have a frequency of at least 200 GHz. The high frequency interconnect structures further may be configured to decrease a potential for crosstalk between a first signal that is conveyed by a first dielectric waveguide of the plurality of dielectric waveguides and a second signal that is conveyed by a second dielectric waveguide of the plurality of dielectric waveguides, such as through control of a passband of the first dielectric waveguide relative to the second dielectric waveguide and/or the use of a crosstalk mitigation structure.

35 Claims, 4 Drawing Sheets

(56) References Cited

U.S. PATENT DOCUMENTS

| | | |
|---|---|---|
| 2002/0021197 A1* | 2/2002 | Elco .............................. 333/248 |
| 2002/0084514 A1 | 7/2002 | Maetani |
| 2003/0202794 A1 | 10/2003 | Izadpanah et al. |
| 2004/0184703 A1 | 9/2004 | Bakir et al. |
| 2007/0127864 A1 | 6/2007 | Welch et al. |
| 2007/0274656 A1* | 11/2007 | Brist et al. .................... 385/132 |
| 2008/0247706 A1 | 10/2008 | Dellmann et al. |
| 2008/0267301 A1* | 10/2008 | Alfano et al. ................. 375/258 |
| 2009/0169219 A1* | 7/2009 | Nakano et al. ............... 398/200 |
| 2010/0231452 A1 | 9/2010 | Babakhani et al. |

* cited by examiner

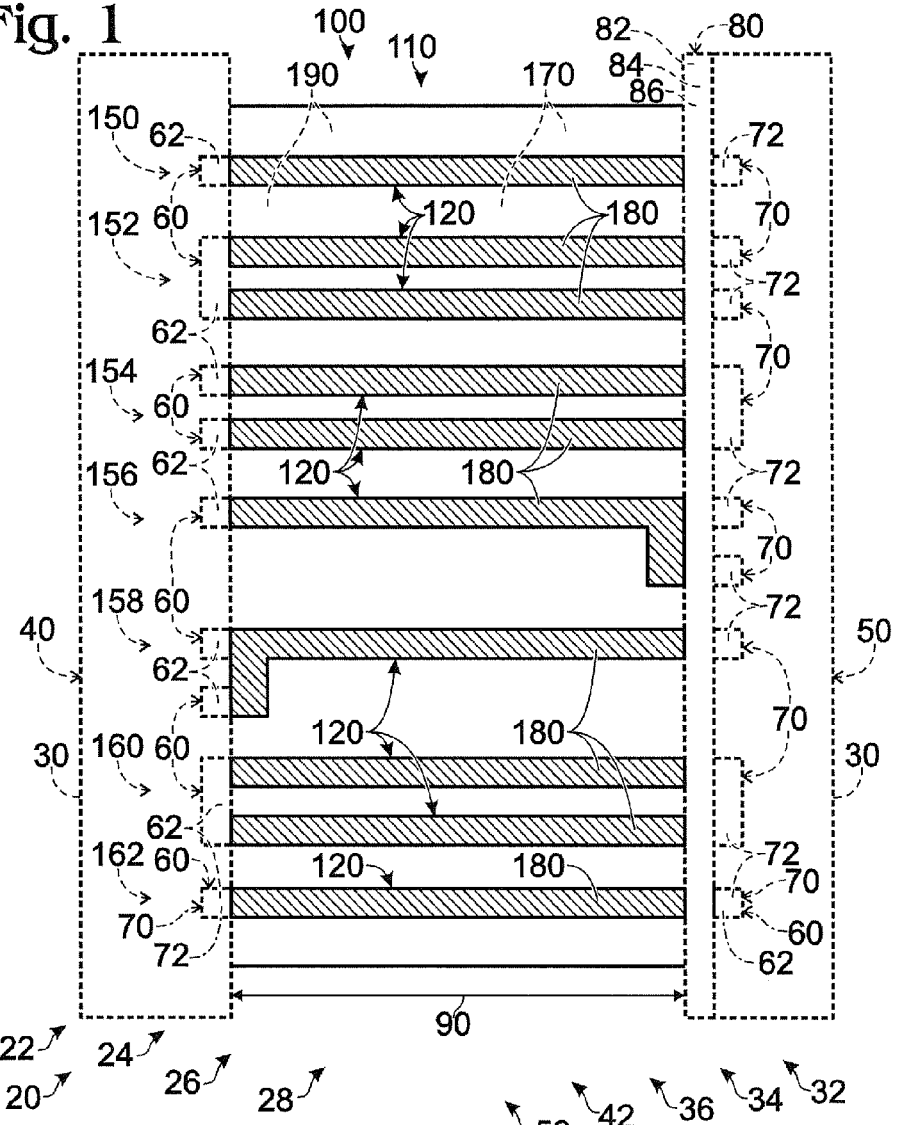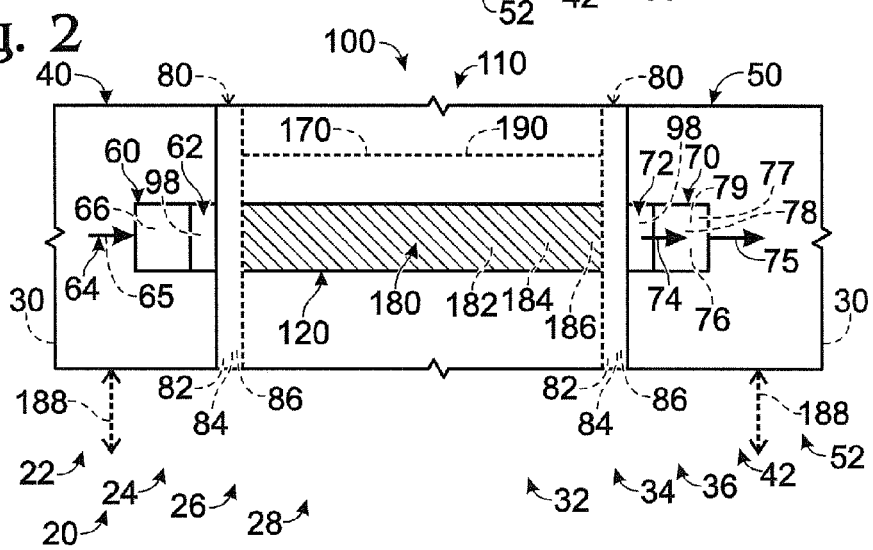

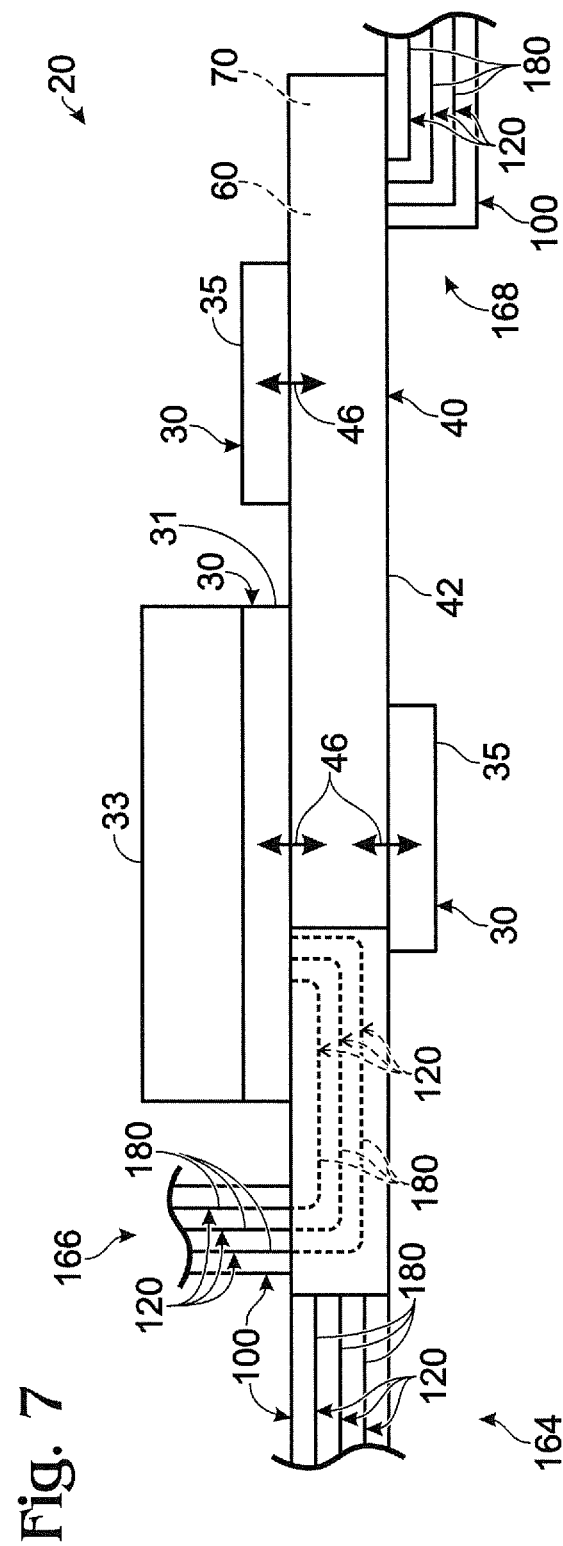

HIGH FREQUENCY INTERCONNECT STRUCTURES, ELECTRONIC ASSEMBLIES THAT UTILIZE HIGH FREQUENCY INTERCONNECT STRUCTURES, AND METHODS OF OPERATING THE SAME

RELATED APPLICATION

This application claims priority to U.S. Provisional Patent Application Ser. No. 61/493,314, which is entitled "High Frequency Interconnection," was filed on Jun. 3, 2011, and the complete disclosure of which is hereby incorporated by reference.

FIELD OF THE DISCLOSURE

The present disclosure is directed generally to high frequency interconnect structures and more particularly to high frequency interconnect structures that include a plurality of dielectric waveguides.

BACKGROUND OF THE DISCLOSURE

As the operating speed, or frequency, of electronic devices increases, there is an ever increasing demand for higher speed, lower cost, lower power, and/or lower overhead interconnects between and/or within electronic assemblies. Traditionally, electrical connections between pairs of terminals have been utilized to form electrical interconnects between electronic circuits. These electrical interconnects, while effective over a range of data transmission rates, which also may be referred to herein as bit rates and/or frequencies, may be ineffective at frequencies that are greater than approximately 20 gigahertz (GHz) due to transmission line losses, dispersion, impedance mismatches, and/or electromagnetic crosstalk. While a maximum frequency of these electrical interconnects may be increased to some extent, such as through the use of equalization techniques, implementing these equalization techniques requires additional system complexity, expense, and/or space within the electronic assemblies.

Optical fibers, which may convey electromagnetic waves, also may be utilized to form optical interconnects between electronic assemblies, and the above-discussed limitations may be less pronounced therein. However, effective packing of the optical fibers within optical interconnects, and/or crosstalk among a plurality of optical fibers within the optical interconnects, may be problematic. In addition, the use of optical fibers generally requires an electrical-to-optical conversion device to generate an optical signal and convey the generated optical signal to the optical fiber, together with a corresponding optical-to-electrical conversion device to receive the optical signal from the optical fiber and convert the received optical signal into an electrical signal. These conversion devices typically consume a significant amount of power, are expensive to design and/or construct, are relatively large, and/or may require mixing different semiconductor technologies. Thus, there exists a need for improved interconnects that may effectively transmit data at frequencies in excess of 20 GHz, while decreasing power consumption, cost, and/or interconnect size.

SUMMARY OF THE DISCLOSURE

High frequency interconnect structures, electronic assemblies that utilize high frequency interconnect structures, and methods of operating the same. The high frequency interconnect structures include a plurality of dielectric waveguides and are configured to communicatively connect a plurality of transmitters with a plurality of receivers and to convey a plurality of signals therebetween. The plurality of signals may include a plurality of electromagnetic waves and may have a frequency of at least 200 GHz. The high frequency interconnect structures further may be configured to decrease a potential for crosstalk between a first signal that is conveyed by a first dielectric waveguide of the plurality of dielectric waveguides and a second signal that is conveyed by a second dielectric waveguide of the plurality of dielectric waveguides. The high frequency interconnect structures may provide this decreased potential for crosstalk through control of a passband of the first dielectric waveguide relative to a passband of the second dielectric waveguide and/or the use of a crosstalk mitigation structure.

In some embodiments, the first signal may have a different frequency than the second signal, and a first passband of the first dielectric waveguide may be configured such that the second signal may not propagate therein. Similarly, a second passband of the second dielectric waveguide may be configured such that the first signal may not propagate therein. In some embodiments, the crosstalk mitigation structure may include a shielding structure and/or an absorbing material. In some embodiments, the high frequency interconnect structure may include a plurality of layers.

In some embodiments, the high frequency interconnect structure may include a launch chip. In some embodiments, the high frequency interconnect structure may form a portion of a probe head assembly. In some embodiments, the high frequency interconnect structure may form a portion of a three-dimensional integrated circuit.

BRIEF DESCRIPTION OF THE DRAWINGS

FIG. 1 is a schematic representation of illustrative, non-exclusive examples of a high frequency interconnect structure according to the present disclosure.

FIG. 2 is a schematic representation of a portion of the high frequency interconnect structure of FIG. 1.

FIG. 7 is a less schematic representation of illustrative, non-exclusive examples of the launch chip of FIG. 6.

DETAILED DESCRIPTION AND BEST MODE OF THE DISCLOSURE

Figure 3:
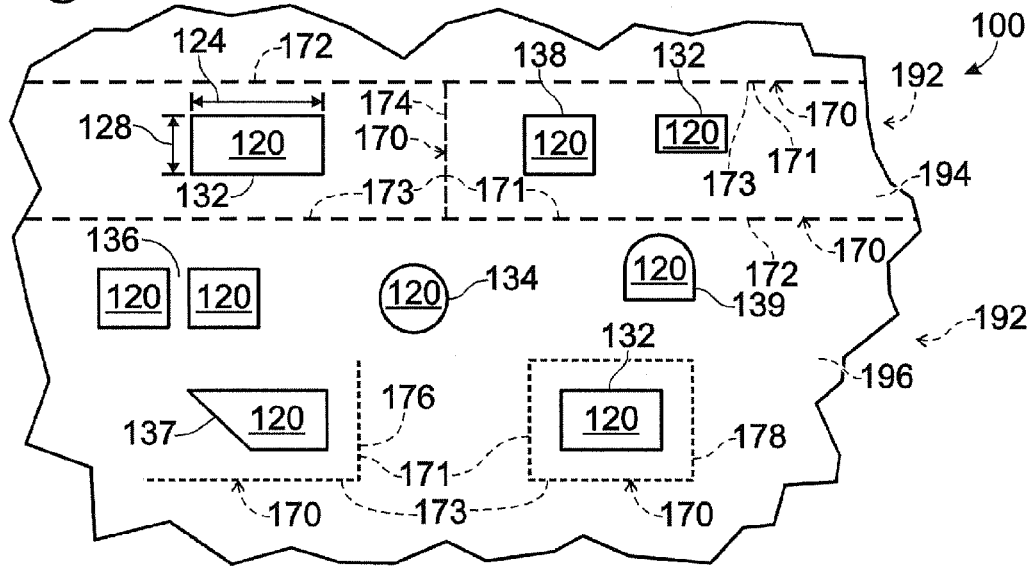
FIG. 3 is a schematic transverse cross-sectional view of illustrative, non-exclusive examples of a high frequency interconnect structure according to the present disclosure.

FIG. 1 is a schematic representation of illustrative, non-exclusive examples of a high frequency interconnect structure 100 that includes a plurality of dielectric waveguides 120 according to the present disclosure, while FIG. 2 is a schematic representation of a portion of the high frequency interconnect structure of FIG. 1. FIGS. 1 and 2 will be discussed in parallel herein and illustrate features and/or components that may be included in high frequency interconnect structure 100, as well as assemblies that may include high frequency interconnect structures 100 according to the present disclosure. While a particular feature, component, and/or assembly may not be illustrated in both of FIGS. 1 and 2, it is within the scope of the present disclosure that any of the high frequency interconnect structures that are discussed herein may include any and/or all of the features and/or components and/or may be included an any of the assemblies that are discussed herein.

As shown in FIGS. 1 and 2, dielectric waveguides 120 may be configured to convey a plurality of signals 180, which also may be referred to herein as high frequency signals 180, microwave signals 180, terahertz signals 180, electromagnetic signals 180, and/or electromagnetic radiation 180, from a plurality of transmitters 60 to a plurality of receivers 70. High frequency interconnect structures that convey a plurality of signals, such as signals 180, may be susceptible to crosstalk among the plurality of signals. This crosstalk, when it occurs, may degrade signal quality during conveyance of the signals. Thus, high frequency interconnect structure 100 further may include one or more crosstalk mitigation structures 170 and/or one or more cladding materials 190 that may be configured to surround and/or optically isolate at least a first portion of the plurality of dielectric waveguides from a second portion of the plurality of dielectric waveguides and, as discussed in more detail herein with reference to FIGS. 3 and 5, may be present at any suitable location within the high frequency interconnect structure. Additionally or alternatively, and as discussed in more detail herein, high frequency interconnect structures 100 also may be configured such that adjacent dielectric waveguides 120 include different passbands and/or such that signals 180 that are conveyed by adjacent dielectric waveguides 120 include different phase velocities.

High frequency interconnect structure 100 also may include, be, and/or be referred to herein as a dielectric waveguide array 110 that includes the plurality of dielectric waveguides 120. As shown in FIG. 1, high frequency interconnect structure 100 and/or dielectric waveguide array 110 may be configured such that a spacing among the plurality of dielectric waveguides within the dielectric waveguide array corresponds to a spacing of the plurality of transmitters 60 and/or a spacing of the plurality of receivers 70. This may provide for transmission of the plurality of signals 180 between transmitters 60 and receivers 70 and/or direct launch and/or direct receipt of the plurality of signals thereby.

High frequency interconnect structure 100 may be included in and/or form a portion of an electronic assembly 20 that includes a first electronic device 40 and a second electronic device 50 that are separated by a separation distance 90, which additionally or alternatively may be referred to herein as a length 90 of high frequency interconnect structure 100. When the high frequency interconnect structure 100 forms a portion of electronic assembly 20, such as is schematically illustrated in dashed lines in FIG. 1, first electronic device 40 may include a first portion of the plurality of transmitters 60 and/or a first portion of the plurality of receivers 70 (as indicated in dash-dot lines). Similarly, second electronic device 50 may include a second portion of the plurality of transmitters 60 (as indicated in dash-dot lines) and/or a second portion of the plurality of receivers 70. In addition, high frequency interconnect structure 100 may be configured to communicatively connect the plurality of transmitters 60 with the plurality of receivers 70 to provide for transmission of the plurality of signals 180 therebetween.

It is within the scope of the present disclosure that at least a portion of the plurality of transmitters 60 may be configured for direct launch of a respective portion of the plurality of signals 180 to and/or into a respective portion of the plurality of dielectric waveguides 120. Similarly, it is also within the scope of the present disclosure that at least a portion of the plurality of receivers 70 may be configured for direct receipt of a respective portion of the plurality of signals 180 from a respective portion of the plurality of dielectric waveguides 120.

As used herein, the term "direct launch," which also may be referred to herein as direct transmission and/or direct conversion transmission, means that the portion of the plurality of transmitters is configured to convey the respective portion of the plurality of signals to and/or into the respective portion of the plurality of dielectric waveguides without the use of an intermediate launch structure to modify, amplify, convert, and/or otherwise convey the respective portion of the plurality of signals. Similarly, and as used herein, the term "direct receipt," which also may be referred to herein as direct conversion receipt, means that the portion of the plurality of receivers is configured to receive the respective portion of the plurality of signals from the respective portion of the plurality of dielectric waveguides without the use of such an intermediate launch structure. This may include direct launch and/or direct receipt of the respective portion of the plurality of signals from any suitable location on first electronic device 40 and/or second electronic device 50, illustrative, non-exclusive examples of which include a surface, face, and/or periphery of the first electronic device and/or the second electronic device.

Electronic assembly 20 also may include one or more interfacing structures 80 that may be configured to convey at least a portion of the plurality of signals between high frequency interconnect structure 100 and first electronic device 40 and/or second electronic device 50. While FIG. 1 schematically illustrates interfacing structure 80 as being present between high frequency interconnect structure 100 and second electronic device 50, it is within the scope of the present disclosure that the interfacing structure may, additionally or alternatively, be located between first electronic device 40 and high frequency interconnect structure 100, as shown in FIG. 2.

Interfacing structure 80 may improve transmission and/or conveyance of the portion of the plurality of signals between the high frequency interconnect structure and the first electronic device and/or the second electronic device by reducing a coupling loss therebetween. Additionally and/or alternatively, the interfacing structure may improve transmission and/or conveyance of the portion of the plurality of signals by decreasing crosstalk among the plurality of signals. Illustrative, non-exclusive examples of interfacing structures 80 according to the present disclosure include any suitable absorbing material 82 that is configured to absorb a portion of the plurality of signals, any suitable dielectric material 84 that is configured to convey a portion of the plurality of signals, and/or any suitable alignment structure 86 that is configured to improve alignment between the high frequency interconnect structure and the plurality of transmitters and/or the plurality of receivers.

As discussed in more detail herein, electronic assembly 20 may be configured for direct launch and/or direct receipt of signals 180. Thus, and while interfacing structure 80 may improve transmission and/or conveyance of signals 180 between transmitters 60 and/or receivers 70 and high frequency interconnect structure 100, it is within the scope of the present disclosure that interfacing structure 80 may not modify, amplify, and/or convert signals 180 therein.

Transmitters 60 may include and/or be in electrical communication with signal launch structures 62 that may be configured to generate signals 180 from a plurality of transmitted electrical signals 64 (as shown in FIG. 2) and convey and/or transmit signals 180 from the plurality of transmitters to the plurality of dielectric waveguides. Similarly, receivers 70 may include and/or be in electrical communication with signal receiving structures 72 that may be configured to receive signals 180 from the plurality of dielectric waveguides and convert signals 180 into a plurality of received electrical signals 74 (as shown in FIG. 2). Illustrative, non-exclusive examples of signal launch structures 62 and/or signal receipt structures 72 that may be utilized with the systems and methods according to the present disclosure include a plurality of antennae 98 (as shown in FIG. 2). Illustrative, non-exclusive examples of antennae include resonant antennae, differentially excited pairs of conductors, half-wave dipole antennae, and/or patch antennae.

As shown in FIGS. 1 and 2, first electronic device 40 and/or second electronic device 50 may include and/or be an integrated circuit device 30. Thus, the plurality of antennae 98, when present, may be fabricated on and/or within the integrated circuit electronic device, such as on a surface thereof and/or within a metallic layer thereof. It is within the scope of the present disclosure that electronic assembly 20 may be configured such that a coupling loss between high frequency interconnect structure 100 and transmitters 60 and/or receivers 70 may be less than 5 decibels (dB), less than 4 dB, less than 3.5 dB, less than 3 dB, less than 2.5 dB, less than 2 dB, less than 1.5 dB, or less than 1 dB.

Transmitters 60 may include any suitable structure that is configured to receive transmitted electric signal 64, convert the transmitted electric signal into one or more signals 180, and/or convey the signals 180 to high frequency interconnect structure 100. As an illustrative, non-exclusive example, and as shown in FIG. 2, transmitters 60 may include voltage-controlled oscillators 66. Voltage-controlled oscillators 66 may be configured to be frequency modulated by a plurality of respective digital input signals 65 that may be supplied thereto. When transmitters 60 include the voltage-controlled oscillators, the voltage-controlled oscillators may be configured to produce a frequency-modulated signal 182 that includes a sloped frequency response that is controlled responsive to the plurality of respective digital input signals. Additionally or alternatively, transmitters 60 may be configured to produce an amplitude-modulated signal 184. As an illustrative, non-exclusive example, the sloped frequency response also may be used as a slope demodulator, which may modify a modulated frequency-shift key signal into an amplitude modulated signal. As additional illustrative, non-exclusive examples, signals 180 may be modulated using frequency modulation with more than two input levels, amplitude modulation with more than two input levels, phase-shift keying, and/or quadrature amplitude modulation.

The sloped frequency response may, but need not, be linear with frequency. As an illustrative, non-exclusive example, it is within the scope of the present disclosure that signals 180 may include binary data signals 186 that include a plurality of "0" data states and a plurality of "1" data states. When signals 180 include the binary data signals, the plurality of dielectric waveguides may be configured to convey a first portion of the binary data signals that correspond to one of the "0" and the "1" state, and to attenuate a second portion of the binary data signals that correspond to the other of the "0" and the "1" state. By doing so, the plurality of dielectric waveguides may provide for transmission of the first portion of the data signals, while decreasing a magnitude of and/or blocking the second portion of the data signals. It is within the scope of the present disclosure that the attenuation may include attenuating the second portion of the data signals by any suitable amount, illustrative, non-exclusive examples of which include attenuating by at least 4 dB, at least 4.5 dB, at least 5 dB, at least 5.5 dB, at least 6 dB, at least 6.5 dB, at least 7 dB, at least 7.5 dB, or at least 8 dB.

Attenuation of the second portion of the data signals may be accomplished in any suitable manner. As an illustrative, non-exclusive example, and when transmitters 60 generate frequency modulated signals 180, a respective transmitter may be configured to generate the first portion of the binary data signals at a first frequency, or within a first frequency range, that is within a passband of a respective waveguide that is in communication therewith, and to generate the second portion of the binary data signals at a second frequency, or within a second frequency range, that is outside the passband, or within a stopband, of the respective waveguide.

As used herein, the term "passband" refers to a range of frequencies that are between an upper cutoff frequency and a lower cutoff frequency of a waveguide. Electromagnetic radiation that is supplied to the waveguide and has a frequency that is within the passband may propagate through the waveguide without attenuation, or at least without substantial attenuation, therein. In contrast, and as used herein, the term "stopband" refers to a range of frequencies that is above the upper cutoff frequency of the waveguide and/or below the lower cutoff frequency of the waveguide. Electromagnetic radiation that is supplied to the waveguide and has a frequency that is within the stopband, or outside the passband, may be attenuated, or decreased in intensity, as it travels through the waveguide.

The passband of a dielectric waveguide 120 may be controlled and/or selected in any suitable manner. As illustrative, non-exclusive examples, and as discussed in more detail herein, a dielectric constant of the dielectric waveguide and/or a characteristic dimension of the dielectric waveguide may be selected to provide a desired passband. As another illustrative, non-exclusive example, and as also discussed in more detail herein, the dielectric waveguide may include and/or be in communication with a resonant structure, such as a band pass filter, that is configured to define the passband and/or the stopband of the dielectric waveguide.

With reference to FIGS. 1 and 2, receivers 70 may include any suitable structure that is configured to receive signals 180 and to convert signals 180 into received electric signals that may then be provided to a remainder of first electronic device 40 and/or second electronic device 50. As an illustrative, non-exclusive example, and as shown in FIG. 2, receivers 70 may include a diode 76 that is configured to receive the received electric signal from signal receipt structure 72 and to produce a baseband output signal 75 therefrom. As another illustrative, non-exclusive example, and as also shown in FIG. 2, receivers 70 may include a mixing circuit 77 that mixes received electric signal 74 with an oscillator 78 in a diode mixer 79 to produce baseband output signal 75, which may then be processed and/or demodulated at a lower frequency. The baseband signal then may be amplified, synchronized, and/or retimed to recover and/or reproduce the transmitted electrical signal.

First electronic device 40 and/or second electronic device 50 may include any suitable structure that includes transmitters 60 and/or receivers 70. As illustrative, non-exclusive examples, first electronic device 40 and/or second electronic device 50 may include and/or form a portion of an integrated circuit device 30, a three-dimensional integrated circuit 32, a device under test 52, an optoelectronic launch chip 42, or launch chip 42, a probe head assembly 36, and/or a test system 34. It is within the scope of the present disclosure that, in addition to signals 180, first electronic device 40 and/or second electronic device 50 may be configured to transmit and/or receive any suitable additional signal 188 that may be provided to and/or received from the first electronic device and/or the second electronic device in any suitable manner. Illustrative, non-exclusive examples of additional signals according to the present disclosure include, but are not limited to, any suitable power signal, data input signal, and/or data output signal that may be supplied to and/or received from the first electronic device and/or the second electronic device using any suitable electrical conductor, wire, cable, and/or reactive coupling.

Electronic assembly 20 may include any suitable electronic assembly that includes first electronic device 40 and second electronic device 50, with high frequency interconnect structure 100 providing a communicative connection therebetween. As illustrative, non-exclusive examples, electronic assembly 20 may include one or more server racks 22, one or more circuit boards 24, one or more integrated circuit chips 26, and/or a single integrated circuit chip 28.

In addition, high frequency interconnect structure 100 may provide the communicative connection over any suitable separation distance 90. As illustrative, non-exclusive examples, separation distance 90 may be at least 0.01 centimeters (cm), at least 0.025 cm, at least 0.05 cm, at least 0.075 cm, at least 0.1 cm, at least 0.25 cm, at least 0.5 cm, at least 0.75 cm, at least 1 cm, at least 2.5 cm, at least 5 cm, at least 10 cm, at least 20 cm, at least 25 cm, at least 30 cm, at least 40 cm, at least 50 cm, at least 60 cm, at least 70 cm, at least 80 cm, at least 90 cm, at least 1 meter (m), at least 2 m, at least 5 m, at least 10 m, at least 25 m, at least 50 m, at least 75 m, at least 100 m, at least 150 m, or at least 200 m. Additionally or alternatively, separation distance 90 also may be less than 500 m, less than 250 m, less than 100 m, less than 75 m, less than 50 m, less than 25 m, less than 20 m, less than 15 m, less than 10 m, less than 7.5 m, less than 5 m, less than 2.5 m, less than 2 m, less than 1.75 m, less than 1.5 m, less than 1.25 m, less than 1 m, less than 90 cm, less than 80 cm, less than 70 cm, less than 60 cm, less than 50 cm, less than 40 cm, less than 30 cm, less than 25 cm, less than 20 cm, less than 15 cm, less than 10 cm, less than 7.5 cm, less than 5 cm, or less than 2.5 cm.

Signals 180 may include any suitable signal that may be generated by transmitters 60, received by receivers 70, and/or conveyed by dielectric waveguides 120 of high frequency interconnect structure 100. As an illustrative, non-exclusive example, signals 180 may include and/or be electromagnetic waves, which also may be referred to herein as electromagnetic radiation. As discussed in more detail herein, high frequency interconnect structure 100 is configured to convey signals 180 at a high frequency and/or to convey signals 180 that include one or more high frequency components. As illustrative, non-exclusive examples, a frequency of signals 180 and/or electromagnetic waves thereof may be at least 100 gigahertz (GHz), at least 200 GHz, at least 250 GHz, at least 500 GHz, at least 750 GHz, at least 1 terahertz (THz), at least 1.5 THz, at least 2 THz, at least 2.5 THz, at least 3 THz, at least 3.5 THz, at least 4 THz, at least 4.5 THz, or at least 5 THz. Additionally or alternatively, a wavelength of signals 180 and/or electromagnetic waves thereof may be less than 10,000 nanometers (nm), less than 5,000 nm, less than 2,500 nm, less than 1000 nm, less than 500 nm, less than 100 nm, less than 50 nm, or less than 10 nm.

In FIG. 1, first electronic device 40 and/or second electronic device 50 are indicated as optionally including one or more transmitters 60 and/or one or more receivers 70. It is within the scope of the present disclosure that transmitters 60 and receivers 70 may be configured and/or distributed in any suitable manner and/or that first electronic device 40 and/or second electronic device 50 may include any suitable number of transmitters 60 and/or receivers 70 that may convey the plurality of signals 180 via any suitable number of dielectric waveguides 120.

Transmitters 60 and receivers 70 may include separate and/or independent structures that are configured for one-way communication. As an illustrative, non-exclusive example, and as indicated in FIG. 1 at 150, first electronic device 40 may include a transmitter 60, which also may be referred to herein as a dedicated transmitter, that provides a signal 180, which also may be referred to herein as a dedicated signal, to a dielectric waveguide 120, which also may be referred to herein as a dedicated dielectric waveguide. The dedicated dielectric waveguide conveys the dedicated signal to a receiver 70, which also may be referred to herein as a dedicated receiver, of second electronic device 50.

As another illustrative, non-exclusive example, and as indicated at 152, first electronic device 40 may include a transmitter 60, which also may be referred to herein as a shared transmitter, that provides a signal 180, which also may be referred to herein as a shared signal, to a plurality of dielectric waveguides 120. The plurality of dielectric waveguides conveys the shared signal to a plurality of receivers 70 on second electronic device 50.

As yet another illustrative, non-exclusive example, and as indicated at 154, first electronic device 40 may include a plurality of transmitters 60 that provide a plurality of signals 180 to a plurality of dielectric waveguides 120. The plurality of dielectric waveguides convey the plurality of signals to a receiver 70, which also may be referred to herein as a shared receiver, on second electronic device 50.

As another illustrative, non-exclusive example, and as indicated at 156, first electronic device 40 may include a transmitter 60, which also may be referred to herein as a shared transmitter, that provides a signal 180, which also may be referred to herein as a shared signal, to a dielectric waveguide 120, which also may be referred to herein as a shared dielectric waveguide. The shared dielectric waveguide conveys the shared signal to a plurality of receivers 70 on second electronic device 50.

As yet another illustrative, non-exclusive example, and as indicated at 158, first electronic device 40 may include a plurality of transmitters 60 that provide a plurality of signals 180 to a dielectric waveguide 120, which also may be referred to herein as a shared dielectric waveguide. The shared dielectric waveguide conveys the plurality of signals to a receiver 70, which also may be referred to herein as a selected receiver, on second electronic device 50. As yet another illustrative, non-exclusive example, and as indicated at 160, a plurality of dielectric waveguides may convey a signal 180 between a transmitter 60 and a receiver 70.

The above-disclosed configurations are discussed with reference to transmitter 60 being present on first electronic device 40 and receiver 70 being present on second electronic device 50. However, it is within the scope of the present disclosure that second electronic device 50 also may include any suitable number of transmitters 60 that are configured to provide any suitable number of signals 180 to receivers 70 that may be present on first electronic device 40. This may include transmitting signals 180 from second electronic device 50 to first electronic device 40 using any suitable configuration, including those that are described herein, and is indicated schematically in FIG. 1 at 162. Additionally or alternatively, it is also within the scope of the present disclosure that one or more transmitters 60 and receivers 70 may be combined into a single structure on first electronic device 40 and/or second electronic device 50 and/or that at least a portion of the plurality of dielectric waveguides 120 may be configured for two-way communication between the first electronic device and the second electronic device.

When a dielectric waveguide 120 is configured to convey a plurality of signals 180, such as is indicated in FIG. 1 at 158, it is within the scope of the present disclosure that electronic assembly 20, such as first electronic device 40 and/or second electronic device 50 thereof, may include any suitable structure that may encode, decode, and/or multiplex the plurality of signals to provide for their reliable transmission therein. As an illustrative, non-exclusive example, electronic assembly 20 may utilize frequency-division multiplexing to encode and/or decode the plurality of signals.

Dielectric waveguides 120 may include any suitable structure and/or material of construction that is configured to convey signals 180 therethrough. As an illustrative, non-exclusive example, dielectric waveguides 120 may be formed from a dielectric material that includes, or has, a dielectric constant. Illustrative, non-exclusive examples of dielectric constants according to the present disclosure include dielectric constants of at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5, or at least 10 and/or dielectric constants of less than 15, less than 14, less than 13, less than 12, less than 11, less than 10, less than 9.5, less than 9, less than 8.5, less than 8, less than 7.5, less than 7, less than 6.5, less than 6, less than 5.5, less than 5, less than 4.5, less than 4, less than 3.5, or less than 3.

It is within the scope of the present disclosure that each of the plurality of dielectric waveguides may be formed from the same dielectric material and/or dielectric materials with the same, or at least substantially the same, dielectric constants. However, it is also within the scope of the present disclosure that the plurality of dielectric waveguides 120 may include a plurality of materials of construction and/or a plurality of dielectric constants. As discussed in more detail herein, this may provide for a high frequency interconnect structure 100 that includes a plurality of dielectric waveguides 120 that define a plurality of different passbands, thereby decreasing crosstalk therebetween.

Thus, a portion, or a first portion, of the plurality of dielectric waveguides may include a different dielectric constant than that of a remainder, or a second portion, of the plurality of dielectric waveguides. This difference in dielectric constants may be produced in any suitable manner and/or by any suitable structure, material, and/or combination thereof. As an illustrative, non-exclusive example, the first portion of the plurality of dielectric waveguides may include a different dielectric material, or material of construction, than the second portion of the plurality of dielectric waveguides. As another illustrative, non-exclusive example, the first portion of the plurality of dielectric waveguides and/or the second portion of the plurality of dielectric waveguides may include one or more supplemental materials, such as particles that are smaller than a wavelength of the signals that are propagated therein, that may change, or modify, the dielectric constant thereof.

As illustrative, non-exclusive examples, at least 10%, at least 20%, at least 30%, at least 40%, at least 50%, at least 60%, at least 70%, at least 80%, at least 90%, at least 95%, or at least 99% of the plurality of dielectric waveguides may include one or more supplemental materials, a different dielectric material, and/or a different dielectric constant when compared to a remainder of the plurality of dielectric waveguides. Additionally or alternatively, less than 99%, less than 95%, less than 90%, less than 80%, less than 70%, less than 60%, less than 50%, less than 40%, less than 30%, less than 20%, or less than 10% of the plurality of dielectric waveguides may include the one or more supplemental materials, the different dielectric material and/or the different dielectric constant when compared to a remainder of the plurality of dielectric waveguides.

As discussed, and although not required to all embodiments, crosstalk among the plurality of signals 180 that are conveyed by the plurality of dielectric waveguides 120 present within high frequency interconnect structure 100 also may be decreased by conveying signals 180 at different phase velocities. More specifically, conveying signals 180 at different velocities may be utilized and/or implemented to reduce coupling between and/or among the plurality of signals 180. This may include conveying a first signal within a first dielectric waveguide and at a first phase velocity that is different from a second phase velocity of a second signal that is conveyed by a second dielectric waveguide, which may be adjacent and/or proximal to the first dielectric waveguide.

This difference between the first phase velocity and the second phase velocity may be accomplished in any suitable manner and/or with any suitable structure, material, and/or combination thereof. As an illustrative, non-exclusive example, the dielectric constant of the first dielectric waveguide may be different from the dielectric constant of the second dielectric waveguide, thereby changing the phase velocities of the respective signals therein. As another illustrative, non-exclusive example, one or more dimensions of the first dielectric waveguide may be different from a corresponding dimension of the second dielectric waveguide. As another illustrative, non-exclusive example, the first dielectric waveguide and/or the second dielectric waveguide may include a meandering signal path that changes a length of the first dielectric waveguide relative to that of the second dielectric waveguide. As another illustrative, non-exclusive example, the first dielectric waveguide and the second dielectric waveguide may not define parallel signal paths. As another illustrative, non-exclusive example, the first dielectric waveguide and/or the second dielectric waveguide may include one or more phase shift elements, such as a material with a different dielectric constant, distributed along a length thereof. As yet another illustrative, non-exclusive example, the first dielectric waveguide and/or the second dielectric waveguide may be configured to vary the phase velocity of the signal that is conveyed thereby along the length thereof. This may include systematic and/or random variation of the phase velocity and may be accomplished in any suitable manner, including varying the dielectric constant of the first dielectric waveguide and/or the second dielectric waveguide along the length thereof.

High frequency interconnect structure 100 and/or array 110 may include and/or be contained in a cladding material 190. Cladding material 190 may include any suitable structure that may be configured to surround, isolate, protect, and/or optically separate at least a portion of the plurality of dielectric waveguides. As an illustrative, non-exclusive example, cladding material 190 may include, or have, a lower refractive index than that of a respective dielectric waveguide 120 that the cladding material is proximal to, in contact with, and/or surrounding. This may increase internal reflection of a respective signal 180 within the respective dielectric waveguide and/or provide for total, or at least substantially total, internal reflection of the respective signal therein.

It is within the scope of the present disclosure that high frequency interconnect structure 100 may include any suitable number of dielectric waveguides 120. As illustrative, non-exclusive examples, the high frequency interconnect structure may include at least 25, at least 50, at least 75, at least 100, at least 150, at least 200, at least 250, at least 300, at least 350, at least 400, at least 450, at least 500, at least 600, at least 700, at least 800, at least 900, or at least 1000 dielectric waveguides. Similarly, electronic assembly 20, first electronic device 40, and/or second electronic device 50 may include any suitable number of transmitters 60 and/or receivers 70, including at least 25, at least 50, at least 75, at least 100, at least 150, at least 200, at least 250, at least 300, at least 350, at least 400, at least 450, at least 500, at least 600, at least 700, at least 800, at least 900, or at least 1000 transmitters and/or receivers.

Figure 4:
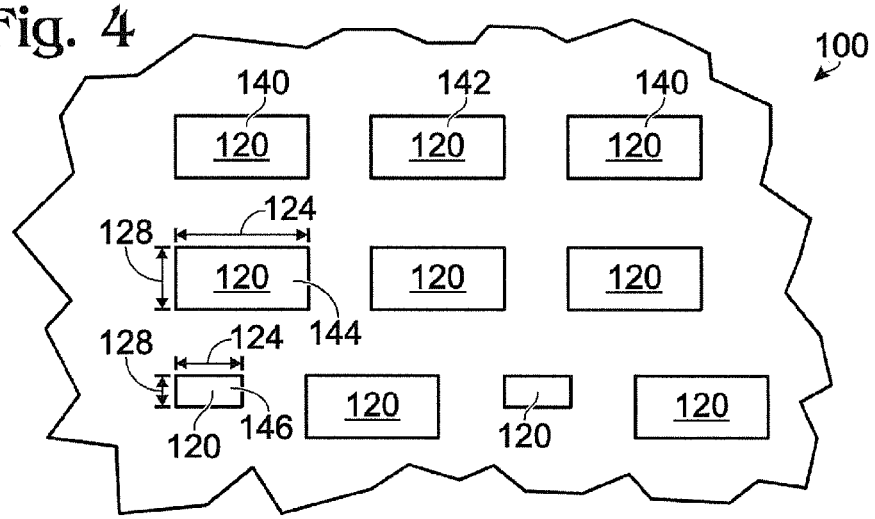
FIG. 4 is another schematic transverse cross-sectional view of illustrative, non-exclusive examples of a high frequency interconnect structure according to the present disclosure.
Figure 5:
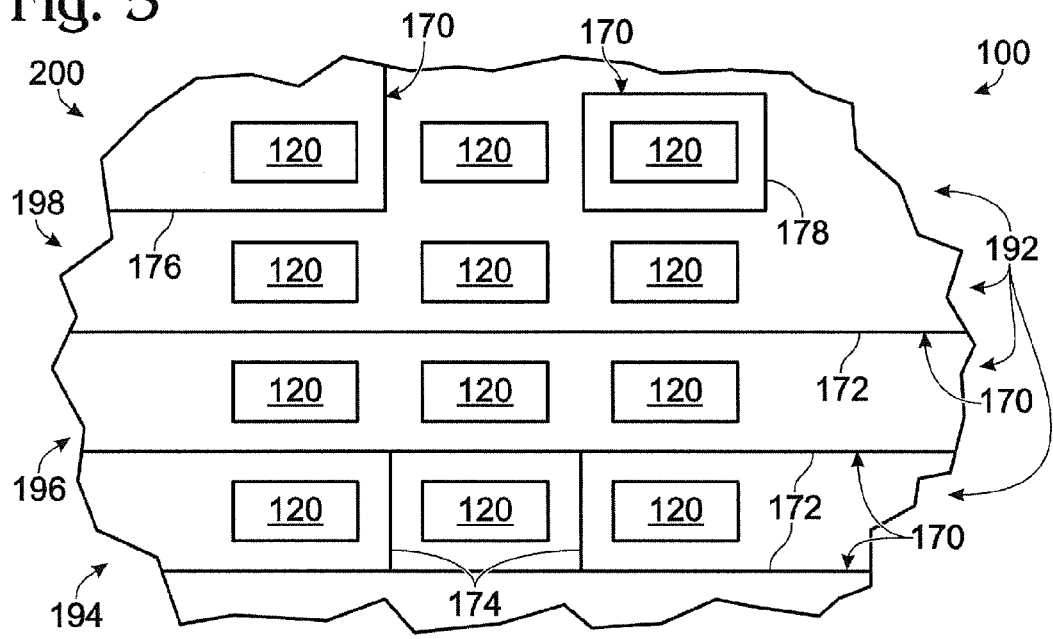
FIG. 5 is yet another schematic transverse cross-sectional view of illustrative, non-exclusive examples of a high frequency interconnect structure according to the present disclosure.

FIGS. 3-5 provide less schematic but still illustrative, non-exclusive examples of transverse cross-sectional views of high frequency interconnect structure 100 of FIGS. 1-2. FIGS. 3-5 illustrate different components and/or features that may be present in high frequency interconnect structures 100 according to the present disclosure, and it is within the scope of the present disclosure that high frequency interconnect structure 100 and/or electronic assemblies 20 that include and/or utilize high frequency interconnect structure 100 may include any suitable portion, or all, of the disclosed components and/or features.

FIG. 3 is a schematic transverse cross-sectional view of illustrative, non-exclusive examples of high frequency interconnect structure 100 according to the present disclosure. FIG. 3 illustrates that dielectric waveguides 120 may include, define, and/or have any suitable cross-sectional shape. In addition, FIG. 3 also illustrates that crosstalk mitigation structure 170 may be present at any suitable location within the high frequency interconnect structure.

Illustrative, non-exclusive examples of cross-sectional shapes of dielectric waveguides 120 according to the present disclosure include circular 134, square 138, rectangular 132, trapezoidal 137, half-round 139, and/or other regular and/or irregular cross-sectional shapes. Rectangular dielectric waveguides 132 may include any suitable width 124, height 128, and/or aspect ratio.

As an illustrative, non-exclusive example, a width of the rectangular dielectric waveguide may be approximately one-half of a wavelength of a respective signal that is conveyed thereby. As another illustrative, non-exclusive example, a height of the rectangular dielectric waveguide may be approximately one-fourth of the wavelength of the respective signal that is conveyed thereby. Illustrative, non-exclusive examples of width 124 and/or height 128 of rectangular dielectric waveguides 132 according to the present disclosure include widths and/or heights of greater than 50 nanometers (nm), greater than 75 nm, greater than 100 nm, greater than 150 nm, greater than 200 nm, greater than 250 nm, greater than 300 nm, greater than 400 nm, greater than 500 nm, greater than 600 nm, greater than 700 nm, greater than 800 nm, greater than 900 nm, greater than 1 micrometer (um) greater than 5 um, greater than 10 um, greater than 25 um, greater than 50 um, greater than 75 um, or greater than 100 um. Additionally or alternatively, width 124 and/or height 128 may be less than 500 um, less than 450 um, less than 400 um, less than 350 um, less than 300 um, less than 250 um, less than 200 um, less than 150 um, less than 100 um, less than 75 um, less than 50 um, less than 25 um, less than 1 um, less than 900 nm, less than 800 nm, less than 700 nm, less than 600 nm, or less than 500 nm.

It is also within the scope of the present disclosure that two or more structures may be combined within high frequency interconnect structure 100 to form a respective dielectric waveguide 120. As an illustrative, non-exclusive example, and as indicated in FIG. 3 at 136, dielectric waveguides 120 may include and/or be slot dielectric waveguides that may include and/or be defined between two or more dielectric structures.

In general, the dimensions of dielectric waveguides 120 may be inversely proportional to the frequency of signals 180 that are conveyed thereby. Thus, increasing the frequency of signals 180 may decrease the dimensions of dielectric waveguides 120, thereby providing for denser packing of the dielectric waveguides within high frequency interconnect structure 100. As an illustrative, non-exclusive example, a half wavelength of a signal 180 that has a frequency of 300 GHz and is propagating in a dielectric waveguide with a dielectric constant of 10 is approximately 158 um. This dimension may be comparable to a dimension of signal launch structures 62 and/or signal receipt structures 72 of electronic assembly 20.

Crosstalk mitigation structure 170 may include any suitable structure that may be present between and/or optically separate at least a portion of the plurality of dielectric waveguides and may be configured to decrease crosstalk among dielectric waveguides 120 and/or among the signals that are conveyed thereby. As an illustrative, non-exclusive example, the crosstalk mitigation structure may include a shielding structure 171 that is configured to reflect a portion of a respective signal 180 that is present outside a respective waveguide.

As another illustrative, non-exclusive example, the crosstalk mitigation structure may include an absorbing material 173 that is configured to absorb the portion of respective signal 180 that is present outside of the respective dielectric waveguide. Illustrative, non-exclusive examples of absorbing materials 173 according to the present disclosure include metallic structures, which also may be referred to herein as metal shields. When crosstalk mitigation structure 170 includes the metallic structure, it is within the scope of the present disclosure that one or more surfaces of the metallic structure may be roughened to increase absorption of the portion of the respective signals thereby. Additionally or alternatively, it is also within the scope of the present disclosure that the metallic structure may be configured to convey one or more electric signals between first electronic device 40 and second electronic device 50.

Crosstalk mitigation structure 170 may be present at any suitable location within high frequency interconnect structure 100. As an illustrative, non-exclusive example, and as indicated in FIG. 3 at 178, crosstalk mitigation structure 170 may completely surround one or more dielectric waveguides 120, such as by surrounding a cross-section and/or a longitudinal length thereof. As another illustrative, non-exclusive example, and as indicated in FIG. 3 at 176, crosstalk mitigation structure 170 may surround a portion of one or more dielectric waveguides 120.

As another illustrative, non-exclusive example, dielectric waveguides 120 may be arranged in a plurality of layers 192, including a first layer 194 and a second layer 196, and crosstalk mitigation structure 170 may be present between a portion of the plurality of layers, as indicated in FIG. 3 at 172. As yet another illustrative, non-exclusive example, and as indicated in FIG. 3 at 174, crosstalk mitigation structure 170 may be present between two or more dielectric waveguides 120 within a given layer 192.

It is within the scope of the present disclosure that high frequency interconnect structure 100 may include a single, monolithic, and/or continuous crosstalk mitigation structures 170. Alternatively, it is also within the scope of the present disclosure that high frequency interconnect structure 100 may include a plurality of crosstalk mitigation structures 170 including at least a first crosstalk mitigation structure and a second crosstalk mitigation structure. When the high frequency interconnect structure includes a plurality of crosstalk mitigation structures 170, a chemical composition of the first crosstalk mitigation structure may be the same as, or different from, a chemical composition of the second crosstalk mitigation structure.

FIG. 4 is another schematic transverse cross-sectional view of illustrative, non-exclusive examples of a high frequency interconnect structure 100 according to the present disclosure. FIG. 4 further illustrates that dielectric waveguides 120 may be configured such that a first passband of a first dielectric waveguide may be different from a second passband of a second, or adjacent dielectric waveguide. The difference between the first passband and the second passband may be accomplished and/or selected in any suitable manner.

As an illustrative, non-exclusive example, and as indicated in FIG. 4 at 144, the first dielectric waveguide may include a first cross-sectional shape. In addition, and as indicated in FIG. 4 at 146, the second dielectric waveguide may include a second cross-sectional shape that is different from the first cross-sectional shape. These differences in cross-sectional shapes, which may include differences in width 124 and/or height 128 of the first dielectric waveguide when compared to the second dielectric waveguide and/or differences in the overall cross-sectional shape of the dielectric waveguides, may provide for a desired, designated, designed, and/or selected difference in the first passband when compared to the second passband.

As another illustrative, non-exclusive example, the first dielectric waveguide may include a first dielectric constant 140 that is different from a second dielectric constant 142 of one or more second, or adjacent, dielectric waveguides. These differences in dielectric constant may provide for a desired, designated, designed, and/or selected difference in the first passband when compared to the second passband.

As another illustrative, non-exclusive example, both the cross-sectional shape and the dielectric material, or dielectric constant, of the first dielectric waveguide may differ from that of the second dielectric waveguide. As yet another illustrative, non-exclusive example, the first dielectric waveguide and/or the second dielectric waveguide may include a band pass filter that defines at least a portion of the first passband and/or the second passband. An illustrative, non-exclusive example of a band pass filter according to the present disclosure includes a photonic bandgap structure.

As discussed in more detail herein with reference to FIGS. 1-2, this difference in the first passband relative to the second passband may decrease crosstalk between a first signal that is conveyed by the first dielectric waveguide and a second signal that is conveyed by the second dielectric waveguide. As an illustrative, non-exclusive example, the first signal may include a first frequency that is different from a second frequency of the second signal, and the first dielectric waveguide may be configured to convey the first signal but to attenuate the second signal. Similarly, the second dielectric waveguide may be configured to convey the second signal but to attenuate the first signal.

This attenuation may include selecting the first passband such that the second frequency is greater than an upper cutoff frequency of the first dielectric waveguide or less than a lower cutoff frequency of the first dielectric waveguide. Similarly, the second passband may be selected such that the first frequency is greater than an upper cutoff frequency of the second dielectric waveguide or less than a lower cutoff frequency of the second dielectric waveguide. It is within the scope of the present disclosure that the first passband may be different from, distinct from, and/or not overlapping with the second passband. However, it is also within the scope of the present disclosure that the first passband may be at least partially coextensive with the second passband.

The first frequency may differ from the second frequency by any suitable amount. As illustrative, non-exclusive examples, a frequency difference between the first frequency and the second frequency may be at least 5%, at least 10%, at least 15%, at least 20%, at least 25%, at least 30%, at least 40%, at least 50%, at least 60%, at least 70%, at least 80%, at least 90%, or at least 100% of the first frequency. Additionally or alternatively, the frequency difference may be less than 200%, less than 175%, less than 150%, less than 125%, less than 100%, less than 95%, less than 90%, less than 80%, less than 70%, less than 60%, or less than 50% of the first frequency.

FIG. 5 is yet another schematic transverse cross-sectional view of illustrative, non-exclusive examples of a high frequency interconnect structure 100 according to the present disclosure. FIG. 5 further illustrates that dielectric waveguides 120 of high frequency interconnect structure 100 may be arranged and/or configured in a plurality of layers 192.

Layers 192 may be separated by any suitable structure that is configured to decrease a potential for crosstalk therebetween. As an illustrative, non-exclusive example, and as indicated at 172, one or more crosstalk mitigation structures 170 may separate each of the dielectric waveguides in a first layer 194 from each of the dielectric waveguides in a second layer 196. As another illustrative, non-exclusive example, and as indicated at 176, crosstalk mitigation structure 170 may separate one or more selected dielectric waveguides in a third layer 198 from one or more selected dielectric waveguides in a fourth layer 200. As yet another illustrative, non-exclusive example, and as indicated at 178, crosstalk mitigation structure 170 may surround a selected dielectric waveguide to isolate the selected dielectric waveguide from a remainder of the dielectric waveguides.

Similarly, high frequency interconnect structure 100 also may include any suitable structure that may decrease a potential for crosstalk between adjacent dielectric waveguides within a given layer 192. This may include the inclusion of crosstalk mitigation structure 170 between adjacent dielectric waveguides within a given layer, as indicated at 174, surrounding a portion of a selected dielectric waveguide as indicated at 176, and/or surrounding all of a selected dielectric waveguide as indicated at 178. Additionally or alternatively, and as discussed in more detail herein with reference to FIG. 4, a passband of a first dielectric waveguide 120 within a given layer 192 may be selected to be different from a passband of a second dielectric waveguide 120 within the given layer 192 such that a first signal that is configured to be conveyed by the first dielectric waveguide will not propagate in the second dielectric waveguide and/or a second signal that is configured to be conveyed by the second dielectric waveguide will not propagate in the first dielectric waveguide.

High frequency interconnect structures 100 according to the present disclosure and/or electronic assemblies 20 that include high frequency interconnect structures 100 may be utilized in, form a portion of, and/or be any suitable structure that is configured to provide a communicative connection between a plurality of transmitters and a plurality of receivers. With this in mind, FIGS. 6-9 provide additional, less schematic but still illustrative, non-exclusive examples of electronic assemblies that may include high frequency interconnect structures 100 according to the present disclosure. While only shown schematically in FIGS. 6-9, it is within the scope of the present disclosure that high frequency interconnect structures 100 that are shown therein may include any of the illustrative, non-exclusive examples of components and/or features that are disclosed in FIGS. 1-5 and discussed in more detail herein with reference thereto.

Figure 6:
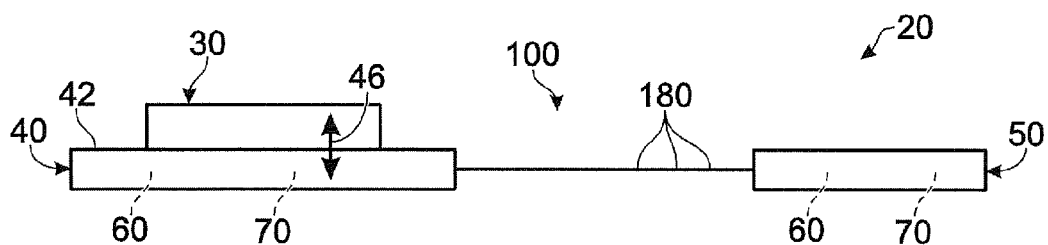
FIG. 6 is a schematic representation of illustrative, non-exclusive examples of an electronic assembly that is configured to convey a plurality of electrical signals between an integrated circuit device and a launch chip according to the present disclosure.

FIG. 6 is a schematic representation of an illustrative, non-exclusive example of an electronic assembly 20 that is configured to convey a plurality of electrical signals 46 between an integrated circuit device 30 and a launch chip 42 according to the present disclosure, while FIG. 7 is a less schematic but still illustrative, non-exclusive example of a configuration of launch chip 42. As a density of individual circuits within integrated circuit device 30 increases, a density of contact pads on the integrated circuit device may increase proportionately, and it is within the scope of the present disclosure that a contact pad density may be higher than a density of dielectric waveguides 120 within high frequency interconnect structure 100. Additionally or alternatively, integrated circuit device 30 may be configured to provide a plurality of electrical connections thereto but may not include a plurality of transmitters and/or receivers that provide for the use of high frequency interconnect structure 100 therewith.

Under these conditions, first electronic device 40, which also may be referred to herein as a launch chip 42, may provide a plurality of electrical connections with integrated circuit device 30 to convey electrical signals 46 therebetween. In addition, the launch chip also may include a plurality of transmitters 60 and/or receivers 70 that may be utilized to convey a plurality of signals 180 between launch chip 42 and second electronic device 50 via high frequency interconnect structure 100. Thus, launch chip 42 may provide an indirect communicative connection between integrated circuit device 30 and second electronic device 50 via the high frequency interconnect structure.

It is within the scope of the present disclosure that launch chip 42 may be configured to receive signals 180 from second electronic device 50 via high frequency interconnect structure 100, to convert the signals to received electrical signals, and to supply and/or provide the received electrical signals to integrated circuit device 30. Additionally or alternatively, it is also within the scope of the present disclosure that launch chip 42 may be configured to receive transmitted electrical signals from integrated circuit device 30, to convert the transmitted electrical signals to signals 180, and to provide signals 180 to second electronic device 50 via high frequency interconnect structure 100. Illustrative, non-exclusive examples of launch chips 42 according to the present disclosure include an interposer, an active interposer, an optoelectronic device, and/or a passive interposer that includes transmitters 60 and/or receivers 70.

In the less schematic but still illustrative, non-exclusive example of FIG. 7, launch chip 42 is illustrated as being in electrical communication with a plurality of integrated circuit devices 30 and being configured to convey a plurality of electrical signals 46 therebetween. The plurality of integrated circuit devices 30, which may include a processor 31 and/or one or more memory modules 35, may be mounted on, mounted to, and/or in electrical communication with the launch chip.

Launch chip 42 may be configured to convert electrical signals 46 that are generated by one or more of the integrated circuit devices into signals 180 and convey signals 180 to another electronic device, such as second electronic device 50 of FIG. 6, using dielectric waveguides 120 of high frequency interconnect structures 100. Similarly, launch chip 42 also may be configured to receive signals 180 from high frequency interconnect structures 100 and to convert signals 180 into electrical signals 46, which may be provided to one or more of the integrated circuit devices.

As shown in FIG. 7, integrated circuit devices 30 may include and/or be in physical, electrical, mechanical, and/or thermal communication with any suitable additional structure, an illustrative, non-exclusive example of which includes heat sink structure 33. In addition, and as shown in dashed lines in FIG. 7, launch chip 42 may include one or more dielectric waveguides 120 that are configured to convey one or more signals 180 therein, such as between an integrated circuit device 30 and a high frequency interconnect structure 100 and/or between respective transmitters 60 and receivers 70 that are internal to launch chip 42.

FIG. 7 further illustrates that, as discussed in more detail herein with reference to FIGS. 1-2, first electronic device 40 (and/or second electronic device 50) may be configured for direct launch and/or direct receipt of signals 180 from any suitable location on the first electronic device (and/or the second electronic device). As an illustrative, non-exclusive example, and as indicated at 164, signals 180 may be launched from and/or received by an edge of the first electronic device and/or the second electronic device. As another illustrative, non-exclusive example, and as indicated at 166, signals 180 may be launched from and/or received by a surface and/or face of the first electronic device and/or the second electronic device in a direction that is perpendicular to the surface and/or face of the first electronic device and/or the second electronic device. As yet another illustrative, non-exclusive example, and as indicated at 168, signals 180 may be launched from and/or received by a surface and/or face of the first electronic device and/or the second electronic device in a direction that is parallel to the surface and/or face of the first electronic device and/or the second electronic device.

Figure 8:
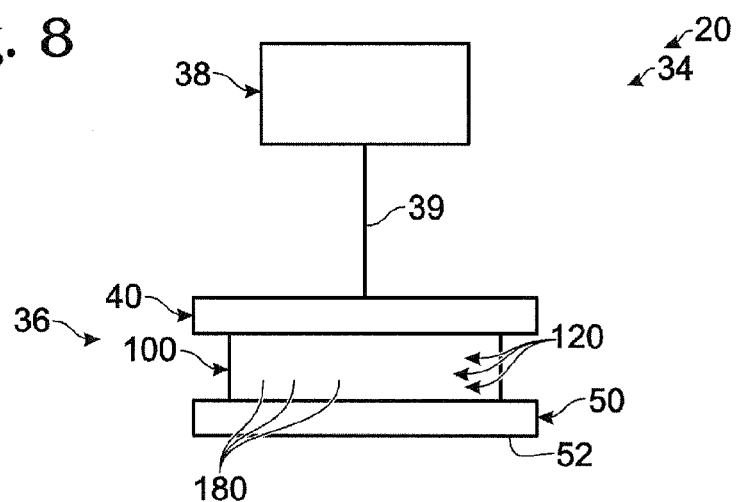
FIG. 8 is a schematic representation of an illustrative, non-exclusive example of a test system that may include a high frequency interconnect structure according to the present disclosure.

FIG. 8 is a schematic representation of an illustrative, non-exclusive example of a test system 34 that may include a high frequency interconnect structure 100 according to the present disclosure. In FIG. 8, first electronic device 40 and high frequency interconnect structure 100, including dielectric waveguides 120 thereof, may form a portion of a probe head assembly 36 that is configured to convey signals 180 between the test system and second electronic device 50, which also may be referred to herein as a device under test 52.

It is within the scope of the present disclosure that probe head assembly 36 may be configured to convey signals 180 to a first device under test to test the operation thereof and, subsequently, to convey signals 180 to a second device under test that is different from the first device under test. As such, probe head assembly 36 may be referred to herein as separably and/or communicatively connecting device under test 52 with test system 34 and/or sequentially connecting a plurality of devices under test with test system 34 to convey signals 180 therebetween.

Test system 34 may include any suitable structure that is configured to generate, receive, and/or analyze signals 180. As an illustrative, non-exclusive example, the test system may include signal generation and analysis equipment 38 that may be configured to provide an electrical signal to and/or receive an electrical signal from probe head assembly 36. As another illustrative, non-exclusive example, test system 34 may include one or more electrical conduits 39 that may be configured to convey the electrical signals between probe head assembly 36 and signal generation and analysis equipment 38.

It is within the scope of the present disclosure that test system 34 may be configured for non-invasive, or non-contact, probing and/or testing of device under test 52. As an illustrative, non-exclusive example, high frequency interconnect structure 100 and/or dielectric waveguides 120 thereof may be configured to couple signals 180 into dielectric waveguides that may form a portion of device under test 52, thereby providing signals 180 to device under test 52 without physical contact, without electrical contact, and/or without contact that modifies and/or causes damage to device under test 52.

Figure 9:
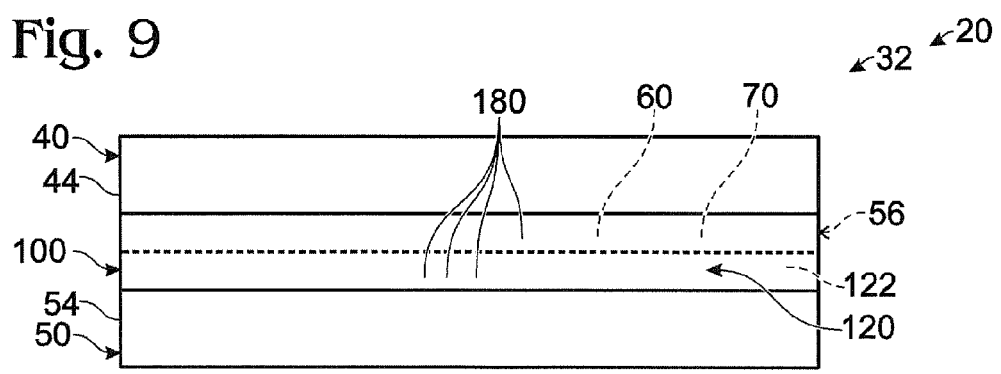
FIG. 9 is a schematic representation of illustrative, non-exclusive examples of a three-dimensional integrated circuit that may include a high frequency interconnect structure according to the present disclosure.

FIG. 9 is a schematic representation of an illustrative, non-exclusive example of a three-dimensional integrated circuit 32 that may include a high frequency interconnect structure 100 according to the present disclosure. In FIG. 9, first electronic device 40 may include and/or be a first integrated circuit device 44, which also may be referred to herein as a first optoelectronic device 44. In addition, second electronic device 50 may include and/or be a second integrated circuit device 54, which also may be referred to herein as a second optoelectronic device 54. First integrated circuit device 44 and second integrated circuit device 54 may include and/or be substantially planar electronic devices and may be arranged in parallel, at least partially coextensive, layers within three-dimensional integrated circuit 32. Furthermore, high frequency interconnect structure 100 may extend between first integrated circuit device 44 and second integrated circuit device 54 to provide a communicative connection therebetween.

Although not required to all embodiments, it is within the scope of the present disclosure that first integrated circuit device 44 and second integrated circuit device 54 may be configured in a face-to-face arrangement, and high frequency interconnect structure 100 may include a separate, or at least separately fabricated, structure that extends between the faces of the respective integrated circuit devices. Alternatively, it is also within the scope of the present disclosure that first integrated circuit device 44 and second integrated circuit device 54 may be configured in a face-to-back arrangement. In the face-to-back arrangement, high frequency interconnect structure 100 may include a plurality of through silicon vias 122 that are fabricated within first integrated circuit device 44 and/or second integrated circuit device 54 and form at least a portion of the plurality of dielectric waveguides 120.

In addition, and as shown in dashed lines in FIG. 9, three-dimensional integrated circuit 32 also may include a third integrated circuit device 56 that may be arranged between first integrated circuit device 44 and second integrated circuit device 54. It is within the scope of the present disclosure that third integrated circuit device 56 may include a plurality of through silicon vias 122 that may form a portion and/or all of high frequency interconnect structure 100 and/or the plurality of dielectric waveguides 120 thereof. The plurality of through silicon vias may function as a passthrough to convey at least a portion of the plurality of signals 180 between first integrated circuit device 44 and second integrated circuit device 54 without modification within third integrated circuit device 56 and/or receipt by a receiver that is located within the third integrated circuit device. Additionally or alternatively, it is also within the scope of the present disclosure that third integrated circuit device 56 may include one or more transmitters 60 and/or receivers 70 that are configured generate, receive, and/or modify signals 180.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A high frequency interconnect structure that is configured to communicatively connect a plurality of transmitters and a plurality of receivers, the high frequency interconnect structure comprising:
a plurality of dielectric waveguides, wherein the plurality of dielectric waveguides is configured to convey a plurality of signals from the plurality of transmitters to the plurality of receivers.

A2. The high frequency interconnect structure of paragraph A1, wherein the plurality of signals includes a plurality of electromagnetic waves, and optionally wherein the plurality of electromagnetic waves are generated by the plurality of transmitters, conveyed by the plurality of dielectric waveguides, and received by the plurality of receivers.

A3. The high frequency interconnect structure of any of paragraphs A1-A2, wherein the plurality of signals includes a frequency of at least 100 gigahertz (GHz), at least 200 GHz, at least 250 GHz, at least 500 GHz, at least 750 GHz, at least 1 terahertz (THz), at least 1.5 THz, at least 2 THz, at least 2.5 THz, at least 3 THz, at least 3.5 THz, at least 4 THz, at least 4.5 THz, or at least 5 THz.

A4. The high frequency interconnect structure of any of paragraphs A1-A3, wherein the plurality of dielectric waveguides includes a dedicated dielectric waveguide configured to convey a dedicated signal of the plurality of signals between a dedicated transmitter of the plurality of transmitters and a dedicated receiver of the plurality of receivers.

A5. The high frequency interconnect structure of any of paragraphs A1-A4, wherein the plurality of dielectric waveguides includes a shared dielectric waveguide configured to convey a shared signal of the plurality of signals between a selected transmitter of the plurality of transmitters and at least two receivers of the plurality of receivers.

A6. The high frequency interconnect structure of any of paragraphs A1-A5, wherein the plurality of dielectric waveguides includes a/the shared dielectric waveguide configured to convey at least two signals of the plurality of signals from at least two transmitters of the plurality of transmitters to at least one of a selected receiver of the plurality of receivers and at least two receivers of the plurality of receivers.

A7. The high frequency interconnect structure of any of paragraphs A1-A6, wherein the plurality of dielectric waveguides is formed from a dielectric material, and optionally wherein the plurality of dielectric waveguides includes a first dielectric waveguide that is formed from a first dielectric material and a second dielectric waveguide that is formed from a second material, wherein the first dielectric material is different from the second dielectric material.

A8. The high frequency interconnect structure of paragraph A7, wherein a dielectric constant of at least a portion of the plurality of dielectric waveguides is at least one of (1) at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5, or at least 10 and (2) less than 15, less than 14, less than 13, less than 12, less than 11, less than 10, less than 9.5, less than 9, less than 8.5, less than 8, less than 7.5, less than 7, less than 6.5, less than 6, less than 5.5, less than 5, less than 4.5, less than 4, less than 3.5, or less than 3, and optionally wherein the portion of the plurality of dielectric waveguides includes at least one of a/the first dielectric waveguide and a/the second dielectric waveguide.

A9. The high frequency interconnect structure of paragraph A8, wherein the portion includes at least one of (1) at least 10%, at least 20%, at least 30%, at least 40%, at least 50%, at least 60%, at least 70%, at least 80%, at least 90%, at least 95%, at least 99%, or all of the plurality of dielectric waveguides and (2) less than 99%, less than 95%, less than 90%, less than 80%, less than 70%, less than 60%, less than 50%, less than 40%, less than 30%, less than 20%, or less than 10% of the plurality of dielectric waveguides.

A10. The high frequency interconnect structure of any of paragraphs A1-A9, wherein at least a portion of the plurality of dielectric waveguides includes a rectangular dielectric waveguide.

A11. The high frequency interconnect structure of paragraph A10, wherein a width of the rectangular dielectric waveguide is approximately one-half a wavelength of a signal of the plurality of signals that is conveyed thereby.

A12. The high frequency interconnect structure of any of paragraphs A10-A11 wherein a height of the rectangular dielectric waveguide is approximately one-fourth of a/the wavelength of a/the signal of the plurality of signals that is conveyed thereby.

A13. The high frequency interconnect structure of any of paragraphs A10-A12, wherein at least one of a/the width and a/the height of the rectangular dielectric waveguide is at least one of (1) greater than 50 nanometers (nm), greater than 75 nm, greater than 100 nm, greater than 150 nm, greater than 200 nm, greater than 250 nm, greater than 300 nm, greater than 400 nm, greater than 500 nm, greater than 600 nm, greater than 700 nm, greater than 800 nm, greater than 900 nm, greater than 1 micrometer (um) greater than 5 um, greater than 10 um, greater than 25 um, greater than 50 um, greater than 75 um, or greater than 100 um; and (2) less than 500 um, less than 450 um, less than 400 um, less than 350 um, less than 300 um, less than 250 um, less than 200 um, less than 150 um, less than 100 um, less than 75 um, less than 50 um, less than 25 um, less than 1 um, less than 900 nm, less than 800 nm, less than 700 nm, less than 600 nm, or less than 500 nm.

A14. The high frequency interconnect structure of any of paragraphs A1-A13, wherein at least a portion of the plurality of dielectric waveguides includes a slot dielectric waveguide.

A15. The high frequency interconnect structure of any of paragraphs A1-A14, wherein the plurality of dielectric waveguides includes a first dielectric waveguide and a second dielectric waveguide, wherein the first dielectric waveguide is configured to convey a first signal of the plurality of signals at a first frequency, wherein the second dielectric waveguide is configured to convey a second signal of the plurality of signals at a second frequency, optionally wherein the first frequency is different from the second frequency, and further optionally wherein the first dielectric waveguide is adjacent to the second dielectric waveguide.

A16. The high frequency interconnect structure of paragraph A15, wherein a frequency difference between the first frequency and the second frequency is at least one of (1) at least 5%, at least 10%, at least 15%, at least 20%, at least 25%, at least 30%, at least 40%, at least 50%, at least 60%, at least 70%, at least 80%, at least 90%, or at least 100% of the first frequency and (2) less than 200%, less than 175%, less than 150%, less than 125%, less than 100%, less than 95%, less than 90%, less than 80%, less than 70%, less than 60%, or less than 50% of the first frequency.

A17. The high frequency interconnect structure of any of paragraphs A15-A16, wherein the first dielectric waveguide is configured such that the second signal will not propagate therein.

A18. The high frequency interconnect structure of any of paragraphs A15-A17, wherein the second dielectric waveguide is configured such that the first signal will not propagate therein.

A19. The high frequency interconnect structure of any of paragraphs A15-A18, wherein the second frequency is at least one of greater than an upper cutoff frequency of the first dielectric waveguide and less than a lower cutoff frequency of the first dielectric waveguide.

A20. The high frequency interconnect structure of any of paragraphs A15-A19, wherein the first frequency is at least one of (1) greater than an upper cutoff frequency of the second dielectric waveguide and (2) less than a lower cutoff frequency of the second dielectric waveguide.

A21. The high frequency interconnect structure of any of paragraphs A15-A20, wherein a dielectric constant of the first dielectric waveguide is different from a dielectric constant of the second dielectric waveguide and/or a characteristic dimension of the first dielectric waveguide is different from a characteristic dimension of the second dielectric waveguide.

A22. The high frequency interconnect structure of any of paragraphs A15-A21, wherein the first dielectric waveguide includes a first band pass filter, and further wherein the second frequency is outside of a first passband of the first band pass filter.

A23. The high frequency interconnect structure of any of paragraphs A15-A22, wherein the second dielectric waveguide includes a second band pass filter, and further wherein the first frequency is outside of a second passband of the second band pass filter.

A24. The high frequency interconnect structure of any of paragraphs A22-A23, wherein at least one of a/the first band pass filter and a/the second band pass filter includes at least one of a photonic bandgap structure, a/the characteristic dimension of the first dielectric waveguide, a/the characteristic dimension of the second dielectric waveguide, a/the dielectric constant of the first dielectric waveguide, and a/the dielectric constant of the second dielectric waveguide.

A25. The high frequency interconnect structure of any of paragraphs A1-A24, wherein the plurality of dielectric waveguides forms a dielectric waveguide array, and further wherein a spacing of the plurality of dielectric waveguides within the dielectric waveguide array corresponds to a spacing of the plurality of transmitters and a spacing of the plurality of receivers.

A26. The high frequency interconnect structure of any of paragraphs A1-A25, wherein the high frequency interconnect structure includes a crosstalk mitigation structure, optionally wherein the crosstalk mitigation structure is configured to decrease crosstalk between a first signal of the plurality of signals that is conveyed by a first dielectric waveguide of the plurality of dielectric waveguides and a second signal of the plurality of signals that is conveyed by a second dielectric waveguide of the plurality of dielectric waveguides, and/or further optionally wherein the crosstalk mitigation structure includes a shielding structure configured to reflect a portion of a signal of the plurality of signals that is present outside a respective dielectric waveguide of the plurality of dielectric waveguides.

A27. The high frequency interconnect structure of paragraph A26, wherein the crosstalk mitigation structure at least one of (1) is located between the first dielectric waveguide and the second dielectric waveguide and (2) optically separates the first dielectric waveguide from the second dielectric waveguide.

A28. The high frequency interconnect structure of any of paragraphs A26-A27, wherein the crosstalk mitigation structure surrounds at least one of the first dielectric waveguide and the second dielectric waveguide, and optionally wherein the crosstalk mitigation structure surrounds at least one of (1) a longitudinal length and (2) a transverse cross-section of at least one of the first dielectric waveguide and the second dielectric waveguide.

A29. The high frequency interconnect structure of any of paragraphs A26-A28, wherein the crosstalk mitigation structure includes an absorbing material, optionally wherein the absorbing material is configured to absorb a portion of a signal of the plurality of signals that is present outside a respective dielectric waveguide of the plurality of dielectric waveguides.

A30. The high frequency interconnect structure of paragraph A29, wherein the absorbing material includes a metallic structure, optionally wherein the metallic structure includes a metal shield.

A31. The high frequency interconnect structure of paragraph A30, wherein a surface of the metallic structure is roughened to increase absorption by the absorbing material of a/the portion of the signal of the plurality of signals that is present outside a/the respective dielectric waveguide of the plurality of dielectric waveguides.

A32. The high frequency interconnect structure of any of paragraphs A30-A31, wherein the metallic structure is further configured to convey an electric signal between a first electronic device that includes at least one of (1) a first portion of the plurality of transmitters and (2) a first portion of the plurality of receivers, and a second electronic device that includes at least one of (1) a second portion of the plurality of transmitters and (2) a second portion of the plurality of receivers.

A33. The high frequency interconnect structure of any of paragraphs A26-A32, wherein the crosstalk mitigation structure is a first crosstalk mitigation structure, and further wherein the high frequency interconnect structure includes a second crosstalk mitigation structure.

A34. The high frequency interconnect structure of paragraph A33, wherein the second crosstalk mitigation structure is configured to decrease crosstalk between a third signal of the plurality of signals that is conveyed by a third dielectric waveguide of the plurality of dielectric waveguides and at least one of the first signal and the second signal.

A35. The high frequency interconnect structure of paragraph A33, wherein the second crosstalk mitigation structure is configured to decrease crosstalk between a third signal of the plurality of signals that is conveyed by a third dielectric waveguide of the plurality of dielectric waveguides and a fourth signal of the plurality of signals that is conveyed by a fourth dielectric waveguide of the plurality of dielectric waveguides.

A36. The high frequency interconnect structure of any of paragraphs A33-A35, wherein the second crosstalk mitigation structure includes a different chemical composition than the first crosstalk mitigation structure.

A37. The high frequency interconnect structure of any of paragraphs A33-A35, wherein the second crosstalk mitigation structure includes the same, or optionally at least substantially the same, chemical composition as the first crosstalk mitigation structure.

A38. The high frequency interconnect structure of any of paragraphs A1-A37, wherein the high frequency interconnect structure includes a plurality of layers, wherein each of the plurality of layers includes a portion of the plurality of dielectric waveguides.

A39. The high frequency interconnect structure of paragraph A38, wherein the high frequency interconnect structure includes a/the crosstalk mitigation structure, and further wherein the crosstalk mitigation structure is located between at least a portion, optionally a majority, and further optionally all, of the plurality of layers.

A40. The high frequency interconnect structure of any of paragraphs A38-A39, wherein the high frequency interconnect structure includes a/the first dielectric waveguide of the plurality of dielectric waveguides that is configured to convey a/the first signal of the plurality of signals at a/the first frequency, and further wherein the high frequency interconnect structure includes a/the second dielectric waveguide of the plurality of dielectric waveguides that is configured to convey a/the second signal of the plurality of signals at a/the second frequency.

A41. The high frequency interconnect structure of paragraph A40, wherein the first frequency is different from the second frequency.

A42. The high frequency interconnect structure of any of paragraphs A40-A41, wherein a first dielectric constant of the first dielectric waveguide is different from a second dielectric constant of the second dielectric waveguide.

A43. The high frequency interconnect structure of any of paragraphs A40-A42, wherein a first characteristic dimension of the first dielectric waveguide is different from a second characteristic dimension of the second dielectric waveguide.

A44. The high frequency interconnect structure of any of paragraphs A40-A43, wherein the first dielectric waveguide is adjacent to the second dielectric waveguide.

A45. The high frequency interconnect structure of any of paragraphs A40-A44, wherein the first dielectric waveguide and the second dielectric waveguide are located in a common layer of the plurality of layers.

A46. The high frequency interconnect structure of any of paragraphs A1-A45, further including a cladding material that surrounds and optically separates at least a portion, and optionally all, of the plurality of dielectric waveguides.

A47. The high frequency interconnect structure of paragraph A46, wherein the cladding material includes a lower refractive index than a refractive index of the plurality of dielectric waveguides.

A48. The high frequency interconnect structure of any of paragraphs A1-A47, wherein the plurality of dielectric waveguides includes at least 25, at least 50, at least 75, at least 100, at least 150, at least 200, at least 250, at least 300, at least 350, at least 400, at least 450, at least 500, at least 600, at least 700, at least 800, at least 900, or at least 1000 dielectric waveguides.

A49. The high frequency interconnect structure of any of paragraphs A1-A48, wherein the plurality of transmitters includes at least 25, at least 50, at least 75, at least 100, at least 150, at least 200, at least 250, at least 300, at least 350, at least 400, at least 450, at least 500, at least 600, at least 700, at least 800, at least 900, or at least 1000 transmitters.

A50. The high frequency interconnect structure of any of paragraphs A1-A49, wherein the plurality of receivers includes at least 25, at least 50, at least 75, at least 100, at least 150, at least 200, at least 250, at least 300, at least 350, at least 400, at least 450, at least 500, at least 600, at least 700, at least 800, at least 900, or at least 1000 receivers.

B1. An electronic assembly, comprising:
a first electronic device;
a second electronic device; and
the high frequency interconnect structure of any of paragraphs A1-A50, wherein the high frequency interconnect structure is configured to communicatively connect a plurality of transmitters and a plurality of receivers, wherein the first electronic device includes at least one of a first portion of the plurality of transmitters and a first portion of the plurality of receivers, and further wherein the second electronic device includes at least one of a second portion of the plurality of transmitters and a second portion of the plurality of receivers.

B2. The electronic assembly of paragraph B1, wherein at least one of the first electronic device and the second electronic device is configured for at least one of direct launch of a portion of the plurality of signals and direct receipt of the portion of the plurality of signals.

B3. The electronic assembly of any of paragraphs B1-B2, wherein at least one of the first electronic device and the second electronic device is configured to convey, and optionally directly convey, and further optionally convey without the use of an intermediate launch structure, a portion of the plurality of signals between a periphery of the respective electronic device and the high frequency interconnect structure.

B4. The electronic assembly of any of paragraphs B1-B3, wherein at least one of the first electronic device and the second electronic device is configured to convey, and optionally directly convey, and further optionally convey without the use of an intermediate launch structure, a portion of the plurality of signals between a surface of the respective electronic device and the high frequency interconnect structure.

B5. The electronic assembly of any of paragraphs B1-B4, wherein a distance between the first electronic device and the second electronic device is at least one of (1) at least 0.25 meters (m), at least 0.5 m, at least 1 m, at least 2 m, at least 5 m, at least 10 m, at least 25 m, at least 50 m, at least 75 m, at least 100 m, at least 150 m, or at least 200 m and (2) less than 500 m, less than 250 m, less than 100 m, less than 75 m, less than 50 m, or less than 25 m, optionally wherein the first electronic device is located within a first server rack and the second electronic device is located within a second server rack that is different from the first server rack, and further optionally wherein the electronic assembly includes at least one, and optionally both, of the first server rack and the second server rack.

B6. The electronic assembly of any of paragraphs B1-B4, wherein a distance between the first electronic device and the second electronic device is at least one of (1) at least 0.1 meters (m), at least 0.2 m, at least 0.3 m, at least 0.4 m, at least 0.5 m, at least 0.6 m, at least 0.7 m, at least 0.8 m, at least 0.9 m, or at least 1.0 m and (2) less than 2 m, less than 1.75 m, less than 1.5 m, less than 1.25 m, less than 1 m, less than 0.9 m, less than 0.8 m, less than 0.7 m, less than 0.6 m, and less than 0.5 m, optionally wherein the first electronic device is mounted and/or located on a first circuit board and the second electronic device is mounted and/or located on a second circuit board that is different from the first circuit board, and further optionally wherein the electronic assembly includes at least one, and optionally both, of the first circuit board and the second circuit board.

B7. The electronic assembly of any of paragraphs B1-B4, wherein a distance between the first electronic device and the second electronic device is at least one of (1) at least 0.05 centimeters (cm), at least 0.075 cm, at least 0.1 cm, at least 0.5 cm, at least 1 cm, at least 5 cm, at least 10 cm, at least 20 cm, or at least 25 cm and (2) less than 100 cm, less than 75 cm, less than 70 cm, less than 60 cm, less than 50 cm, less than 40 cm, less than 30 cm, or less than 25 cm, optionally wherein the first electronic device forms a portion of a first integrated circuit chip and the second electronic device forms a portion of a second integrated circuit chip that is different from the first integrated circuit chip, and further optionally wherein the electronic assembly includes at least one, and optionally both, of the first integrated circuit chip and the second integrated circuit chip.

B8. The electronic assembly of any of paragraphs B1-B4, wherein a distance between the first electronic device and the second electronic device is at least one of (2) at least 0.01 centimeters (cm), at least 0.025 cm, at least 0.05 cm, at least 0.075 cm, at least 0.1 cm, at least 0.25 cm, at least 0.5 cm, at least 0.75 cm, at least 1 cm, at least 2.5 cm, at least 5 cm, or at least 10 cm and (2) less than 40 cm, less than 30 cm, less than 25 cm, less than 20 cm, less than 15 cm, less than 10 cm, less than 7.5 cm, less than 5 cm, or less than 2.5 cm, optionally wherein the first electronic device includes a first integrated circuit on an integrated circuit chip and the second electronic device includes a second integrated circuit on the integrated circuit chip, and further optionally wherein the electronic assembly includes the integrated circuit chip.

B9. The electronic assembly of any of paragraphs B1-B8, wherein the electronic assembly further includes an interfacing structure configured to convey at least a portion of the plurality of signals between the high frequency interconnect structure and at least one of the first electronic device and the second electronic device.

B10. The electronic assembly of paragraph B9, wherein the interfacing structure is configured to reduce a coupling loss between the high frequency interconnect structure and at least one of the first electronic device and the second electronic device.

B11. The electronic assembly of any of paragraphs B9-B10, wherein the interfacing structure is configured to decrease crosstalk among the plurality of signals that is conveyed by the plurality of dielectric waveguides.

B12. The electronic assembly of any of paragraphs B9-B11, wherein the interfacing structure includes at least one of an absorbing material that is configured to absorb a portion of the plurality of signals, a dielectric material that is configured to convey a portion of the plurality of signals, and an alignment structure that is configured to improve alignment between the high frequency interconnect structure and at least one of the plurality of transmitters and the plurality of receivers.

B13. The electronic assembly of any of paragraphs B1-B12, wherein at least a portion of the plurality of dielectric waveguides is configured to convey two or more signals of the plurality of signals, and optionally wherein the electronic assembly is configured to encode and decode the two or more signals using frequency-division multiplexing.

B14. The electronic assembly of any of paragraphs B1-B13, wherein the plurality of transmitters includes a plurality of signal launch structures that is configured to convey the plurality of signals from the plurality of transmitters to the plurality of dielectric waveguides, and further wherein the plurality of receivers includes a plurality of signal receiving structures that is configured to receive the plurality of signals from the plurality of dielectric waveguides.

B15. The electronic assembly of paragraph B14, wherein at least one, and optionally both, of the plurality of signal launch structures and the plurality of signal receiving structures includes a plurality of antennae.

B16. The electronic assembly of paragraph B15, wherein the plurality of antennae includes at least one, optionally two, optionally three, and further optionally all, of a plurality of resonant antennae, a plurality of differentially excited pairs of conductors, a plurality of half-wave dipole antennae, and a plurality of differential patch antennae, and optionally wherein the plurality of antennae is located on a first metallic layer of the first electronic device and a second metallic layer of the second electronic device.

B17. The electronic assembly of any of paragraphs B15-B16, wherein a coupling loss between the high frequency interconnect structure and at least one, and optionally both, of the plurality of transmitters and the plurality of receivers is less than 5 decibels (dB), less than 4 dB, less than 3.5 dB, less than 3 dB, less than 2.5 dB, less than 2 dB, less than 1.5 dB, or less than 1 dB.

B18. The electronic assembly of any of paragraphs B1-B17, wherein the plurality of transmitters includes a plurality of voltage-controlled oscillators, and optionally wherein the plurality of voltage-controlled oscillators is configured to be frequency modulated by a plurality of digital input signals.

B19. The electronic assembly of paragraph B18, wherein the plurality of voltage-controlled oscillators is configured to produce a frequency-modulated signal, optionally wherein the frequency-modulated signal includes a sloped frequency response, and further optionally wherein a frequency of the sloped frequency response is responsive to the plurality of digital input signals.

B20. The electronic assembly of any of paragraphs B1-B18, wherein the plurality of transmitters is configured to produce an amplitude-modulated signal.

B21. The electronic assembly of any of paragraphs B1-B20, wherein the plurality of signals include a plurality of binary data signals that includes a plurality of "0" data states and a plurality of "1" data states, and further wherein the plurality of dielectric waveguides is configured to convey a first portion of the plurality of binary data signals that corresponds to one of the "0" data state and the "1" data state and to attenuate a second portion of the plurality of binary data signals that corresponds to the other of the "0" data state and the "1" data state.

B22. The electronic assembly of paragraph B21, wherein the attenuation includes attenuating the second portion of the plurality of binary data signals by at least 4 decibels (dB), at least 4.5 dB, at least 5 dB, at least 5.5 dB, at least 6 dB, at least 6.5 dB, at least 7 dB, at least 7.5 dB, or at least 8 dB.

B23. The electronic assembly of any of paragraphs B21-B22, wherein the plurality of transmitters is configured to generate the first portion of the plurality of binary data signals at a first frequency that is within a passband of the respective plurality of dielectric waveguides, and further wherein the plurality of transmitters is configured to generate the second portion of the plurality of binary data signals at a second frequency that is outside the passband of the respective plurality of dielectric waveguides.

B24. The electronic assembly of paragraph B23, wherein the plurality of dielectric waveguides includes a plurality of resonant structures that is configured to define the passband of the plurality of dielectric waveguides.

B25. The electronic assembly of any of paragraphs B1-B24, wherein the plurality of receivers includes a plurality of diodes that is configured to produce a plurality of baseband output signals from the plurality of signals.

B26. The electronic assembly of any of paragraphs B1-B25, wherein at least one, and optionally both, of the first electronic device and the second electronic device includes at least one of an integrated circuit, a three-dimensional integrated circuit, a device under test, an optoelectronic launch chip, a probe head, and a test system.

B27. The electronic assembly of any of paragraphs B1-B26, wherein at least one, and optionally both, of the first electronic device and the second electronic device includes at least one of a reactively coupled data input, a reactively coupled data output, and a reactively coupled power supply.

C1. The electronic assembly of any of paragraphs B1-B27, wherein the electronic assembly further includes an integrated circuit device, wherein the first electronic device includes a launch chip, and further wherein the launch chip is configured to form a plurality of electrical connections with the integrated circuit device and to convey the plurality of signals between the integrated circuit device and the second electronic device via the plurality of electrical connections.

C2. The electronic assembly of paragraph C1, wherein the launch chip includes at least one of an interposer, an active interposer, and a passive interposer.

C3. The electronic assembly of any of paragraphs C1-C2, wherein the launch chip is configured to convert the plurality of signals to a plurality of electrical signals to convey the plurality of signals between the integrated circuit device and the second electronic device.

C4. The electronic assembly of any of paragraphs B1-B27, wherein the first electronic device and the high frequency interconnect structure form a portion of a probe head assembly, wherein the second electronic device includes a device under test, and further wherein the probe head assembly is configured to convey the plurality of signals between a test system that includes the probe head assembly and the device under test.

C5. The electronic assembly of paragraph C4, wherein the electronic assembly further includes the test system.

C6. The electronic assembly of any of paragraphs C4-C5, wherein the probe head assembly is configured to separably and communicatively connect with the device under test to convey the plurality of signals therebetween.

C7. The electronic assembly of any of paragraphs C4-C6, wherein the probe head assembly further includes an electrical conduit that is configured to convey an electrical signal between the test system and the device under test.

C8. The electronic assembly of any of paragraphs B1-B27, wherein the first electronic device includes a first integrated circuit device, wherein the second electronic device includes a second integrated circuit device, and further wherein the first integrated circuit device and the second integrated circuit device form a portion of a three-dimensional integrated circuit device.

C9. The electronic assembly of paragraph C8, wherein the first electronic device includes a substantially planar first electronic device, wherein the second electronic device includes a substantially planar second electronic device, and further wherein the first electronic device and the second electronic device are arranged in parallel, at least partially coextensive, layers within the three-dimensional integrated circuit device.

C10. The electronic assembly of any of paragraphs C8-C9, wherein the first electronic device and the second electronic device are configured in a face-to-face arrangement, and further wherein the high frequency interconnect structure is located between the first electronic device and the second electronic device.

C11. The electronic assembly of any of paragraphs C8-C9, wherein the first electronic device and the second electronic device are configured in a face-to-back arrangement, wherein the first electronic device includes a plurality of through silicon vias, and further wherein the plurality of through silicon vias form a portion of the plurality of dielectric waveguides.

C12. The electronic assembly of any of paragraphs C8-C11, wherein the electronic assembly further includes a third electronic device, wherein the third electronic device includes a third integrated circuit device, and further wherein the third electronic device is arranged between the first electronic device and the second electronic device.

C13. The electronic assembly of paragraph C12, wherein the third electronic device includes a plurality of through silicon vias that are configured to convey a portion of the plurality of signals between the first electronic device and the second electronic device, and optionally wherein the plurality of through silicon vias form a portion, and optionally all, of the plurality of dielectric waveguides.

C14. The electronic assembly of paragraph C13, wherein the second electronic device includes a receiver that is configured to receive a selected signal from a selected through silicon via of the plurality of through silicon vias.

D1. A method of conveying a plurality of signals between a first electronic device and a second electronic device, the method comprising, generating a plurality of transmitted electric signals;

converting the plurality of transmitted electric signals to a plurality of electromagnetic signals;

conveying the plurality of electromagnetic signals between the first electronic device and the second electronic device using the high frequency interconnect structure of any of paragraphs A1-A50; and converting the plurality of electromagnetic signals to a plurality of received electric signals.

E1. The use of any of the high frequency interconnect structures of any of paragraphs A1-A50 and/or any of the electronic assemblies of any of paragraphs B1-C14 with the method of paragraph D1.

E2. The use of the method of paragraph D1 with any of the high frequency interconnect structures of any of paragraphs A1-A50 and/or any of the electronic assemblies of any of paragraphs B1-C14.

E3. The use of a high frequency interconnect structure that includes a plurality of dielectric waveguides to communicatively connect a plurality of transmitters and a plurality of receivers.

INDUSTRIAL APPLICABILITY

The systems and methods disclosed herein are applicable to the electronics industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A high frequency interconnect structure that is configured to communicatively connect a plurality of transmitters and a plurality of receivers, the high frequency interconnect structure comprising:
   a plurality of dielectric waveguides, wherein the plurality of dielectric waveguides is configured to convey a plurality of signals from the plurality of transmitters to the plurality of receivers, wherein the plurality of signals includes a plurality of electromagnetic waves, and further wherein the plurality of signals includes a frequency of at least 200 GHz; and
   a crosstalk mitigation structure, wherein the crosstalk mitigation structure is configured to decrease crosstalk between a first signal of the plurality of signals that is conveyed by a first dielectric waveguide of the plurality of dielectric waveguides and a second signal of the plurality of signals that is conveyed by a second dielectric waveguide of the plurality of dielectric waveguides wherein the crosstalk mitigation structure is located between the first dielectric waveguide and the second dielectric waveguide and includes an absorbing material configured to absorb a portion of a signal of the plurality of signals that is present outside the first and second dielectric waveguides.

2. The high frequency interconnect structure of claim 1, wherein the plurality of dielectric waveguides is formed from a respective dielectric material, wherein a dielectric constant of at least a portion of the plurality of dielectric waveguides is at least 2 and less than 10.

3. The high frequency interconnect structure of claim 1, wherein at least a portion of the plurality of dielectric waveguides includes a rectangular dielectric waveguide.

4. The high frequency interconnect structure of claim 3, wherein a width of the rectangular dielectric waveguide is approximately one-half a wavelength of a signal of the plurality of signals that is conveyed thereby, and further wherein a height of the rectangular dielectric waveguide is approximately one-fourth of the wavelength of the signal of the plurality of signals that is conveyed thereby.

5. The high frequency interconnect structure of claim 3, wherein at least one of a width and a height of the rectangular dielectric waveguide is greater than 50 nm and less than 200 um.

6. The high frequency interconnect structure of claim 1, further including a cladding material that surrounds at least a portion of the plurality of dielectric waveguides.

7. The high frequency interconnect structure of claim 1, wherein the first dielectric waveguide is configured to convey the first signal of the plurality of signals at a first frequency, wherein the second dielectric waveguide is configured to convey the second signal of the plurality of signals at a second frequency, wherein the first frequency is different from the second frequency, and further wherein the first dielectric waveguide is adjacent to the second dielectric waveguide.

8. The high frequency interconnect structure of claim 7, wherein the first dielectric waveguide is configured such that the second signal will not propagate therein, and further wherein the second dielectric waveguide is configured such that the first signal will not propagate therein.

9. The high frequency interconnect structure of claim 1, wherein the absorbing material includes a metallic structure.

10. The high frequency interconnect structure of claim 9, wherein the metallic structure is further configured to convey an electric signal between a first electronic device that includes at least one of (1) a first portion of the plurality of transmitters and (2) a first portion of the plurality of receivers, and a second electronic device that includes at least one of (1) a second portion of the plurality of transmitters and (2) a second portion of the plurality of receivers.

11. The high frequency interconnect structure of claim 1, wherein the high frequency interconnect structure includes a plurality of layers, wherein each of the plurality of layers includes a portion of the plurality of dielectric waveguides.

12. The high frequency interconnect structure of claim 11, wherein the crosstalk mitigation structure is a first crosstalk mitigation structure, and further wherein the high frequency interconnect structure includes a second crosstalk mitigation structure, wherein the second crosstalk mitigation structure is located between at least a portion of the plurality of layers.

13. The high frequency interconnect structure of claim 11, wherein the first dielectric waveguide of the plurality of dielectric waveguides is configured to convey the first signal of the plurality of signals at a first frequency, wherein the second dielectric waveguide of the plurality of dielectric waveguides is configured to convey the second signal of the plurality of signals at a second frequency, wherein the first frequency is different from the second frequency, wherein the first dielectric waveguide is adjacent to the second dielectric waveguide, and further wherein the first dielectric waveguide and the second dielectric waveguide are located in a common layer of the plurality of layers.

14. The high frequency interconnect structure of claim 1, wherein the plurality of dielectric waveguides includes at least 100 dielectric waveguides.

15. An electronic assembly, comprising:
   a first electronic device;
   a second electronic device;
   a high frequency interconnect structure, configured to communicatively connect a plurality of transmitters and a plurality of receivers, wherein the first electronic device includes at least one of a first portion of the plurality of transmitters and a first portion of the plurality of receivers, wherein the second electronic device includes at least one of a second portion of the plurality of transmitters and a second portion of the plurality of receivers; and further wherein the high frequency interconnect structure includes a plurality of dielectric waveguides configured to convey a plurality of signals from the plurality of transmitters to the plurality of receivers, wherein the plurality of signals includes a plurality of electromagnetic waves, and further wherein the plurality of signals includes a frequency of at least 200 GHz; and
   an interfacing structure configured to convey at least a portion of the plurality of signals between the high frequency interconnect structure and at least one of the first electronic device and the second electronic device, wherein the interfacing structure is configured to reduce a coupling loss between the high frequency interconnect structure and at least one of the first electronic device and the second electronic device, and further wherein the interfacing structure is configured to decrease crosstalk among the plurality of signals that is conveyed by the plurality of dielectric waveguides.

16. The electronic assembly of claim 15, wherein at least one of the first electronic device and the second electronic device includes at least one of an integrated circuit, a three-dimensional integrated circuit, a device under test, an opto-electronic launch chip, a probe head, and a probing system.

17. The electronic assembly of claim 15, wherein the high frequency interconnect structure further includes a crosstalk mitigation structure configured to decrease crosstalk between a first signal of the plurality of signals that is conveyed by a first dielectric waveguide of the plurality of dielectric waveguides and a second signal of the plurality of signals that is conveyed by a second dielectric waveguide of the plurality of dielectric waveguides, and further wherein the crosstalk mitigation structure is located between the first dielectric waveguide and the second dielectric waveguide.

18. The electronic assembly of claim 17, wherein the crosstalk mitigation structure includes an absorbing material configured to absorb a portion of a signal of the plurality of signals that is present outside the first and second dielectric waveguides.

19. The electronic assembly of claim 18, wherein the absorbing material includes a metallic structure.

20. The electronic assembly of claim 19, wherein the metallic structure is further configured to convey an electric signal between the first electronic device and the second electronic device.

21. An electronic assembly, comprising:
a first electronic device;
a second electronic device; and
a high frequency interconnect structure, wherein:
(i) the high frequency interconnect structure is configured to communicatively connect a plurality of transmitters and a plurality of receivers;
(ii) the first electronic device includes at least one of a first portion of the plurality of transmitters and a first portion of the plurality of receivers;
(iii) the second electronic device includes at least one of a second portion of the plurality of transmitters and a second portion of the plurality of receivers;
(iv) the high frequency interconnect structure includes a plurality of dielectric waveguides configured to convey a plurality of signals from the plurality of transmitters to the plurality of receivers;
(v) the plurality of signals includes a plurality of electromagnetic waves;
(vi) the plurality of signals includes a frequency of at least 200 GHz;
(vii) the plurality of signals includes a plurality of binary data signals that includes a plurality of "0" data states and a plurality of "1" data states;
(viii) the plurality of dielectric waveguides is configured to convey a first portion of the plurality of binary data signals that corresponds to one of the "0" data state and the "1" data state and to attenuate a second portion of the plurality of binary data signals that corresponds to the other of the "0" data state and the "1" data state;
(ix) the attenuation includes attenuating the second portion of the plurality of binary data signals by at least 6 dB.

22. The electronic assembly of claim 21, wherein the high frequency interconnect structure further includes a crosstalk mitigation structure configured to decrease crosstalk between a first signal of the plurality of signals that is conveyed by a first dielectric waveguide of the plurality of dielectric waveguides and a second signal of the plurality of signals that is conveyed by a second dielectric waveguide of the plurality of dielectric waveguides, and further wherein the crosstalk mitigation structure is located between the first dielectric waveguide and the second dielectric waveguide.

23. The electronic assembly of claim 22, wherein the crosstalk mitigation structure includes an absorbing material configured to absorb a portion of a signal of the plurality of signals that is present outside the first and second dielectric waveguides.

24. The electronic assembly of claim 23, wherein the absorbing material includes a metallic structure.

25. The electronic assembly of claim 24, wherein the metallic structure is further configured to convey an electric signal between the first electronic device and the second electronic device.

26. The electronic assembly of claim 21, wherein the electronic assembly further includes an interfacing structure configured to convey at least a portion of the plurality of signals between the high frequency interconnect structure and at least one of the first electronic device and the second electronic device, wherein the interfacing structure is configured to reduce a coupling loss between the high frequency interconnect structure and at least one of the first electronic device and the second electronic device, and further wherein the interfacing structure is configured to decrease crosstalk among the plurality of signals that is conveyed by the plurality of dielectric waveguides.

27. The electronic assembly of claim 21, wherein at least one of the first electronic device and the second electronic device includes at least one of an integrated circuit, a three-dimensional integrated circuit, a device under test, an opto-electronic launch chip, a probe head, and a probing system.

28. An electronic assembly, comprising:
a first electronic device;
a second electronic device; and
a high frequency interconnect structure, wherein:
(i) the high frequency interconnect structure is configured to communicatively connect a plurality of transmitters and a plurality of receivers;
(ii) the first electronic device includes at least one of a first portion of the plurality of transmitters and a first portion of the plurality of receivers;
(iii) the second electronic device includes at least one of a second portion of the plurality of transmitters and a second portion of the plurality of receivers;
(iv) the high frequency interconnect structure includes a plurality of dielectric waveguides configured to convey a plurality of signals from the plurality of transmitters to the plurality of receivers;
(v) the plurality of signals includes a plurality of electromagnetic waves;
(vi) the plurality of signals includes a frequency of at least 200 GHz;
(vii) the first electronic device and the high frequency interconnect structure form a portion of a probe head assembly;
(viii) the second electronic device includes a device under test; and
(ix) the probe head assembly is configured to convey the plurality of signals between a test system that includes the probe head assembly and the device under test.

29. The electronic assembly of claim 28, wherein the high frequency interconnect structure further includes a crosstalk mitigation structure configured to decrease crosstalk between a first signal of the plurality of signals that is conveyed by a first dielectric waveguide of the plurality of dielectric waveguides and a second signal of the plurality of signals that is conveyed by a second dielectric waveguide of the plurality of dielectric waveguides, and further wherein the crosstalk mitigation structure is located between the first dielectric waveguide and the second dielectric waveguide.

30. The electronic assembly of claim 29, wherein the crosstalk mitigation structure includes an absorbing material configured to absorb a portion of a signal of the plurality of signals that is present outside the first and second dielectric waveguides.

31. The electronic assembly of claim 30, wherein the absorbing material includes a metallic structure.

32. The electronic assembly of claim 31, wherein the metallic structure is further configured to convey an electric signal between the first electronic device and the second electronic device.

33. The electronic assembly of claim 28, wherein the electronic assembly further includes an interfacing structure configured to convey at least a portion of the plurality of signals between the high frequency interconnect structure and at least one of the first electronic device and the second electronic device, wherein the interfacing structure is configured to reduce a coupling loss between the high frequency interconnect structure and at least one of the first electronic device and the second electronic device, and further wherein the interfacing structure is configured to decrease crosstalk among the plurality of signals that is conveyed by the plurality of dielectric waveguides.

34. The electronic assembly of claim 28, wherein:
the plurality of signals includes a plurality of binary data signals that includes a plurality of "0" data states and a plurality of "1" data states;
(ii) the plurality of dielectric waveguides is configured to convey a first portion of the plurality of binary data signals that corresponds to one of the "0" data state and the "1" data state and to attenuate a second portion of the plurality of binary data signals that corresponds to the other of the "0" data state and the "1" data state; and
(iii) the attenuation includes attenuating the second portion of the plurality of binary data signals by at least 6 dB.

35. The electronic assembly of claim 28, wherein at least one of the first electronic device and the second electronic device includes at least one of an integrated circuit, a three-dimensional integrated circuit, a device under test, an opto-electronic launch chip, a probe head, and a probing system.

* * * * *